(12) United States Patent
Maejima

(10) Patent No.: US 8,605,506 B2
(45) Date of Patent: *Dec. 10, 2013

(54) THREE DIMENSIONAL STACKED NONVOLATILE SEMICONDUCTOR MEMORY

(71) Applicant: Hiroshi Maejima, Chigasaki (JP)

(72) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/693,449

(22) Filed: Dec. 4, 2012

(65) Prior Publication Data

US 2013/0094296 A1    Apr. 18, 2013

Related U.S. Application Data

(63) Continuation of application No. 13/281,591, filed on Oct. 26, 2011, now Pat. No. 8,345,479, which is a continuation of application No. 12/950,509, filed on Nov. 19, 2010, now Pat. No. 8,068,364, which is a continuation of application No. 12/406,524, filed on Mar. 18, 2009, now Pat. No. 7,852,675.

(30) Foreign Application Priority Data

Apr. 23, 2008  (JP) ................................. 2008-112657

(51) Int. Cl.
*G11C 16/04* (2006.01)
(52) U.S. Cl.
USPC ............. 365/185.11; 365/185.23; 365/185.05

(58) Field of Classification Search
USPC .............. 365/51, 63, 185.05, 185.11, 185.18, 365/185.23
See application file for complete search history.

(56) References Cited

U.S. PATENT DOCUMENTS

| 5,896,317 | A | 4/1999 | Ishii et al. |
| 6,141,250 | A | 10/2000 | Kashimura |
| 6,992,349 | B2 * | 1/2006 | Lee et al. ...................... 257/324 |
| 7,091,890 | B1 | 8/2006 | Sasaki et al. |

(Continued)

FOREIGN PATENT DOCUMENTS

| JP | 6-338602 | 12/1994 |
| JP | 2004-319577 | 11/2004 |

(Continued)

OTHER PUBLICATIONS

H. Tanaka, et al., "Bit Cost Scalable Technology with Punch and Plug Process for Ultra High Density Flash Memory", 2007 Symposium on VLSI Technology Digest of Technical Papers, pp. 14-15.

(Continued)

*Primary Examiner* — Gene Auduong
(74) *Attorney, Agent, or Firm* — Oblon, Spivak, McClelland, Maier & Neustadt, L.L.P.

(57) ABSTRACT

A three dimensional stacked nonvolatile semiconductor memory according to an example of the present invention includes a memory cell array comprised of first and second blocks disposed side by side in a first direction, and a driver disposed on one end of the memory cell array in a second direction orthogonal to the first direction. First select gate lines in the first block and first select gate lines in the second block are connected to the driver after they are commonly connected in one end in the second direction of the memory cell array in a relation of one to one.

23 Claims, 20 Drawing Sheets

(56) References Cited

U.S. PATENT DOCUMENTS

| | | | |
|---|---|---|---|
| 7,115,939 B2 * | 10/2006 | Forbes | 257/314 |
| 7,335,906 B2 * | 2/2008 | Toda | 257/2 |
| 7,453,722 B2 * | 11/2008 | Choi et al. | 365/163 |
| 7,852,675 B2 | 12/2010 | Maejima | |
| 7,852,676 B2 | 12/2010 | Maejima | |
| 7,859,902 B2 | 12/2010 | Maejima | |
| 8,068,364 B2 * | 11/2011 | Maejima | 365/185.11 |
| 8,284,584 B2 * | 10/2012 | Makino | 365/63 |
| 8,345,479 B2 * | 1/2013 | Maejima | 365/185.11 |
| 2005/0047209 A1 | 3/2005 | Masuoka et al. | |
| 2006/0003541 A1 | 1/2006 | Choi et al. | |
| 2007/0252201 A1 | 11/2007 | Kito et al. | |
| 2008/0112211 A1 | 5/2008 | Toda | |
| 2009/0010071 A1 | 1/2009 | Lee | |
| 2009/0267128 A1 | 10/2009 | Maejima | |
| 2009/0267139 A1 | 10/2009 | Maejima | |
| 2009/0268522 A1 | 10/2009 | Maejima | |
| 2009/0268523 A1 | 10/2009 | Maejima | |
| 2010/0097858 A1 | 4/2010 | Tokiwa et al. | |
| 2010/0133627 A1 | 6/2010 | Mizukami et al. | |
| 2011/0063910 A1 | 3/2011 | Maejima | |
| 2011/0063913 A1 | 3/2011 | Maejima | |
| 2011/0069550 A1 | 3/2011 | Maejima | |

FOREIGN PATENT DOCUMENTS

| | | |
|---|---|---|
| JP | 2005-71411 A | 3/2005 |
| JP | 2007-266143 A | 10/2007 |
| KR | 0674952 | 1/2007 |
| KR | 2008-003816 | 4/2008 |

OTHER PUBLICATIONS

Office Action issued Oct. 25, 2001, Korean Patent Application No. 2009-24113 (w/English language translation).

Japanese Office Action issued Dec. 11, 2012 in Patent Application No. 2008-112657.

* cited by examiner

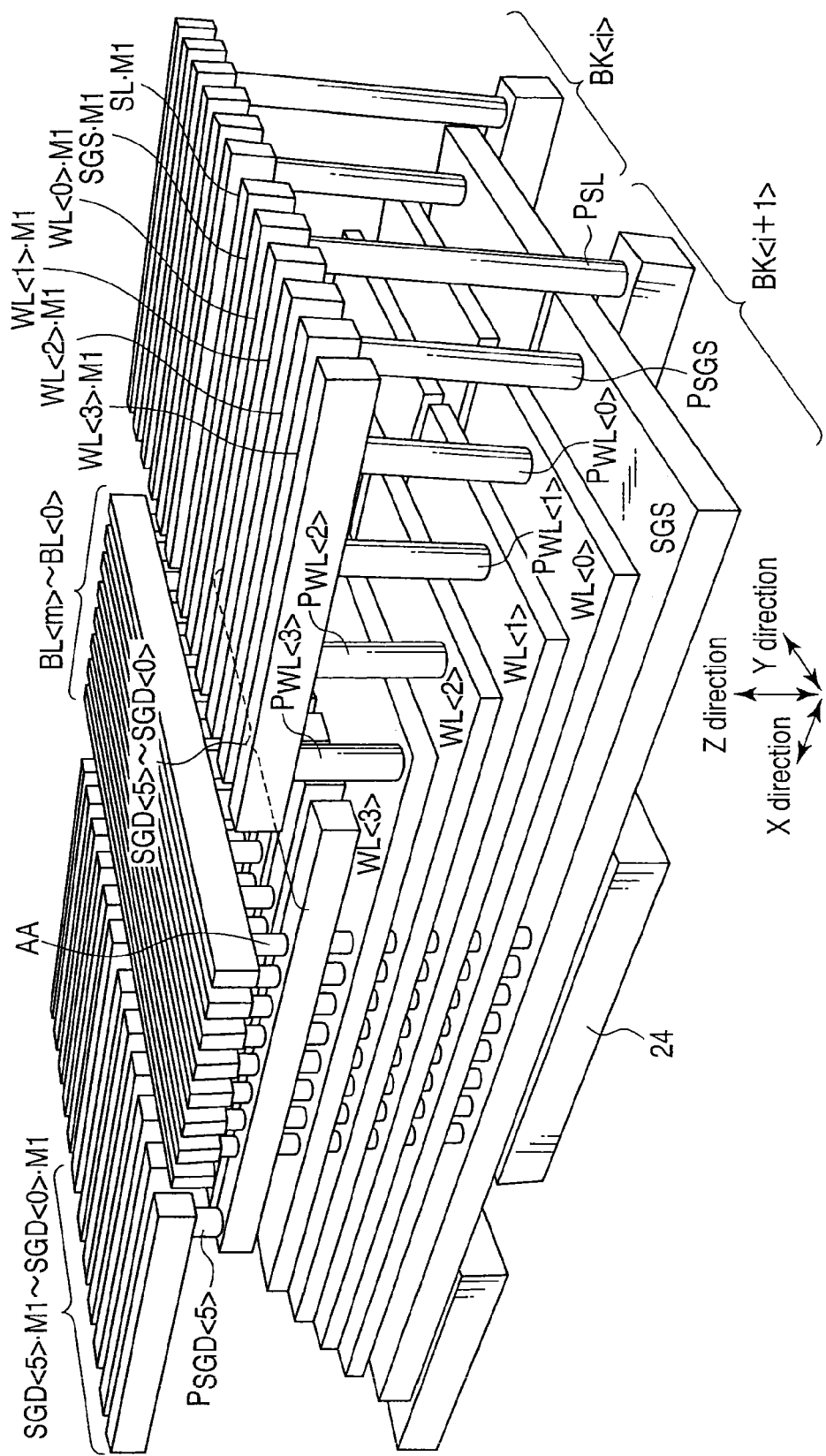
F I G. 1

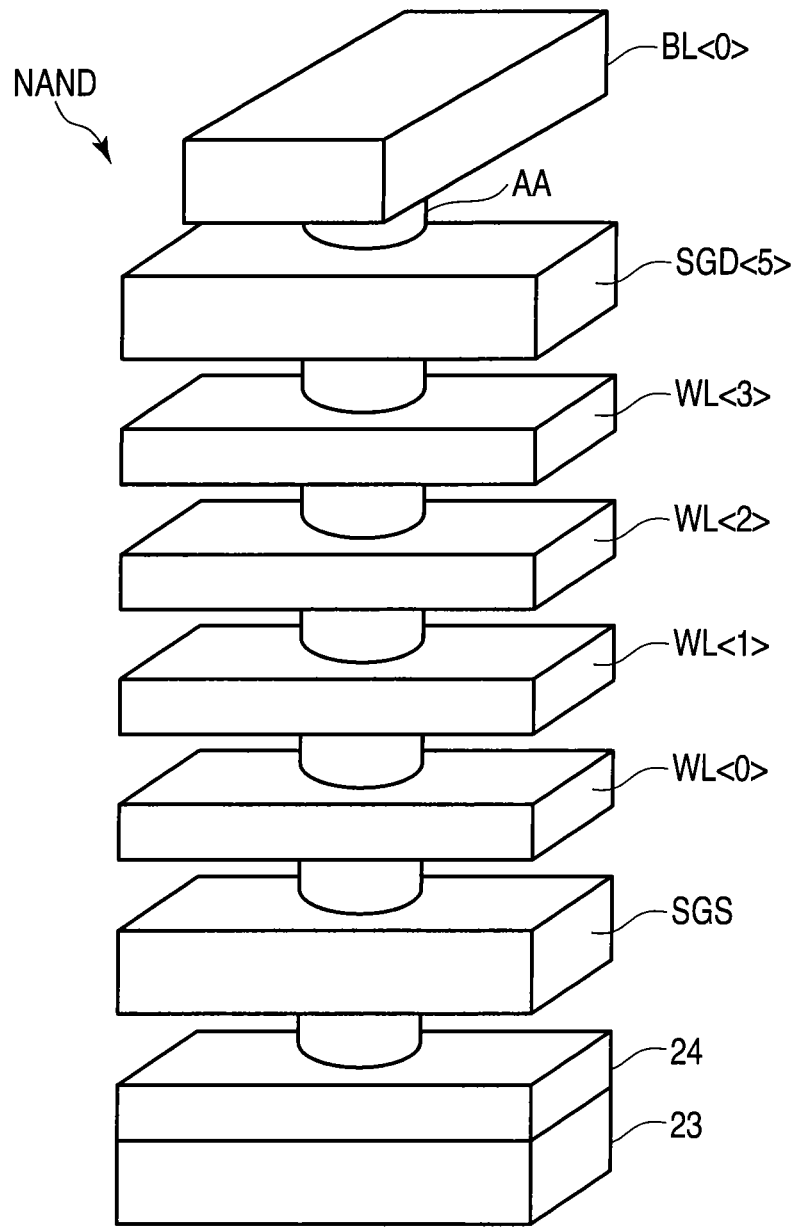
F I G. 6

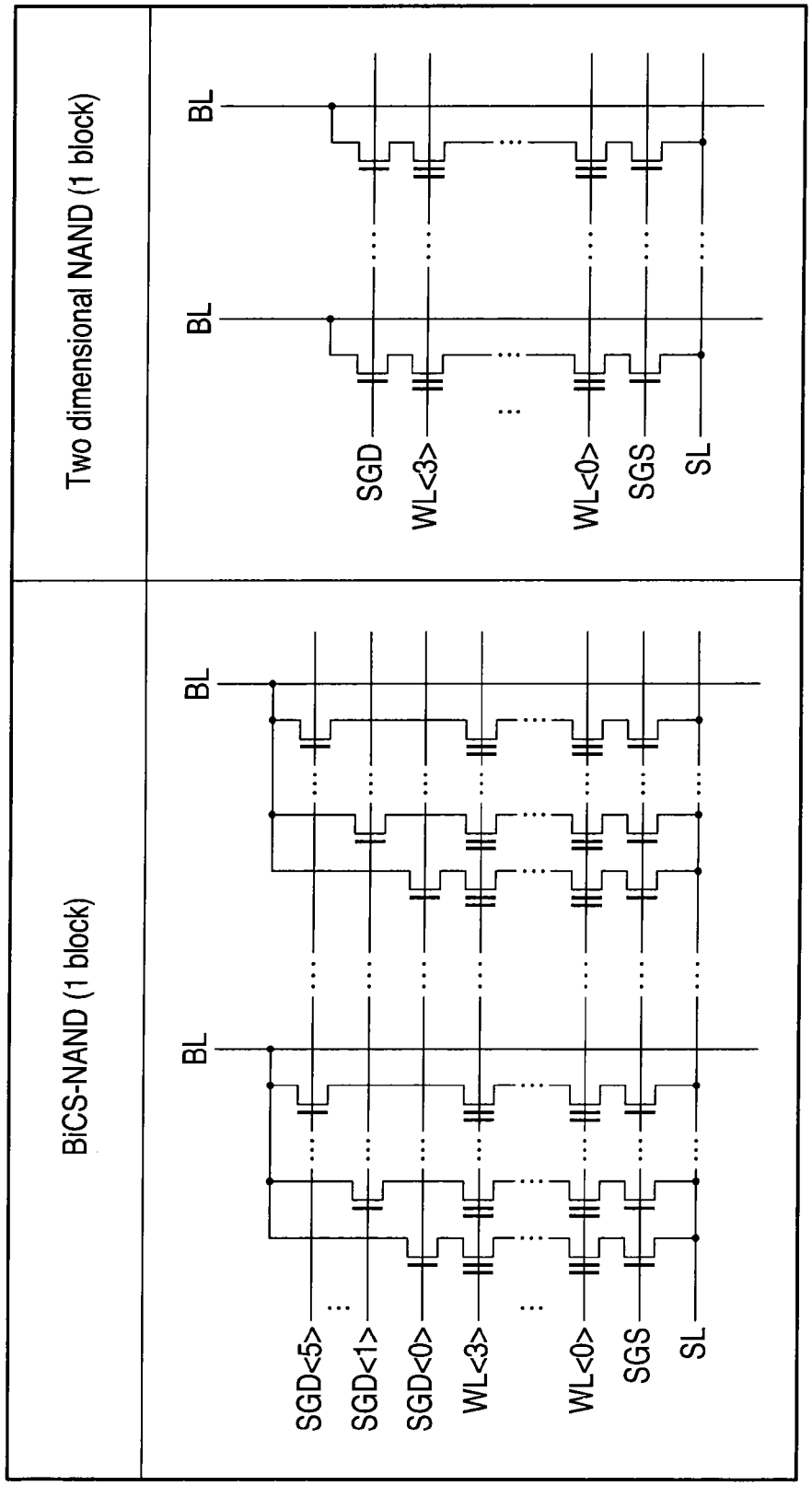
F I G. 8

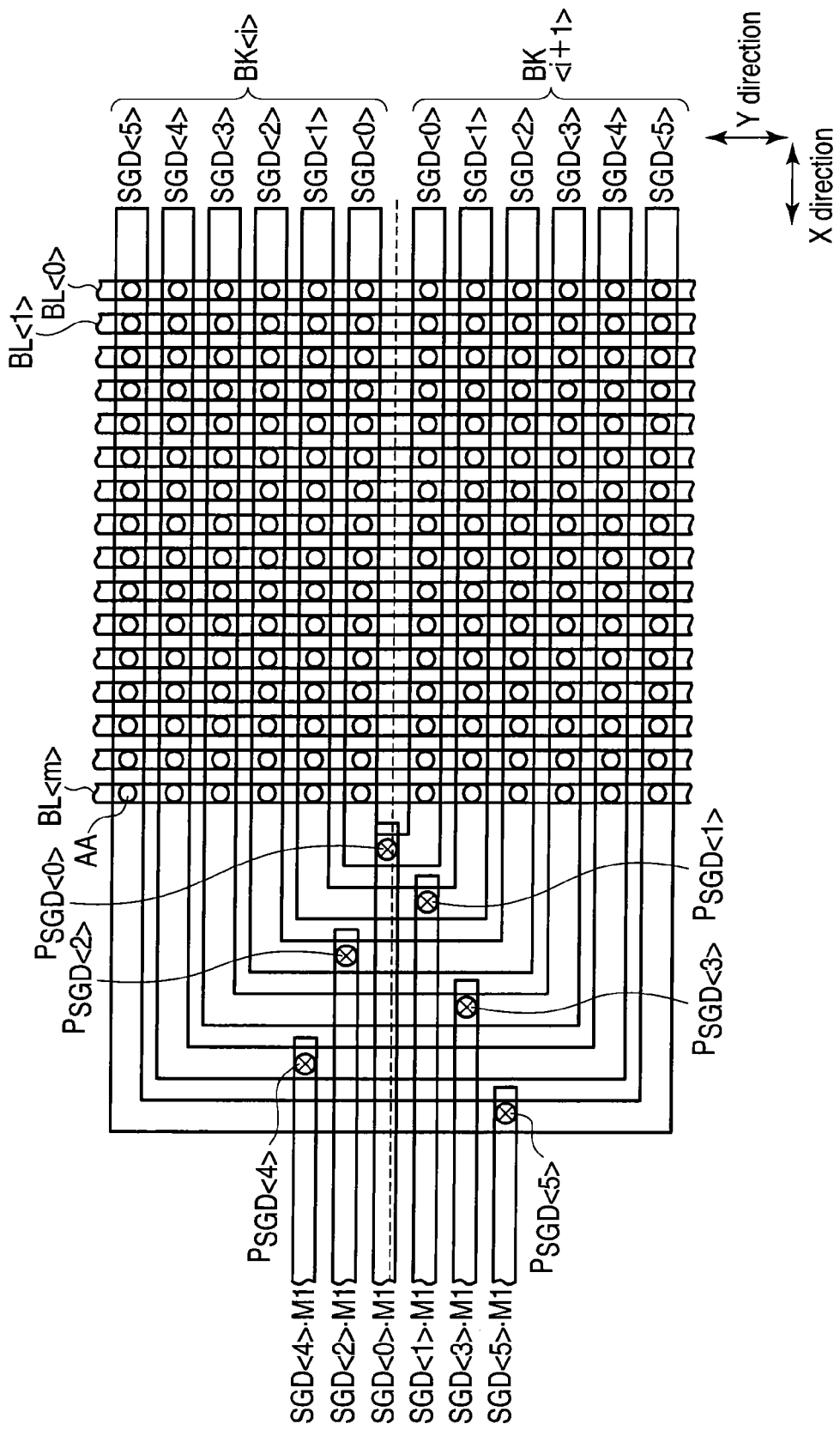
F I G. 14

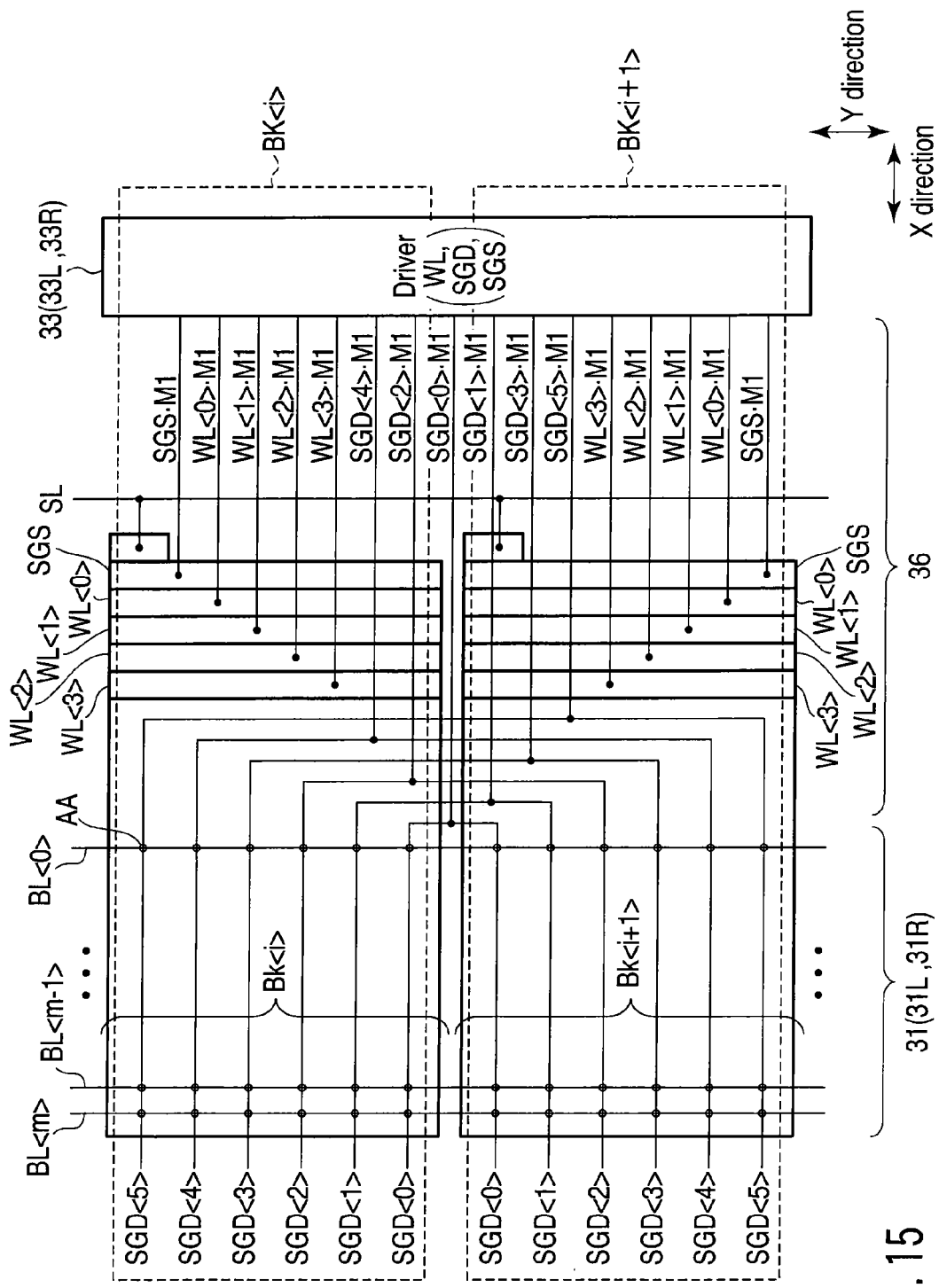
F I G. 15

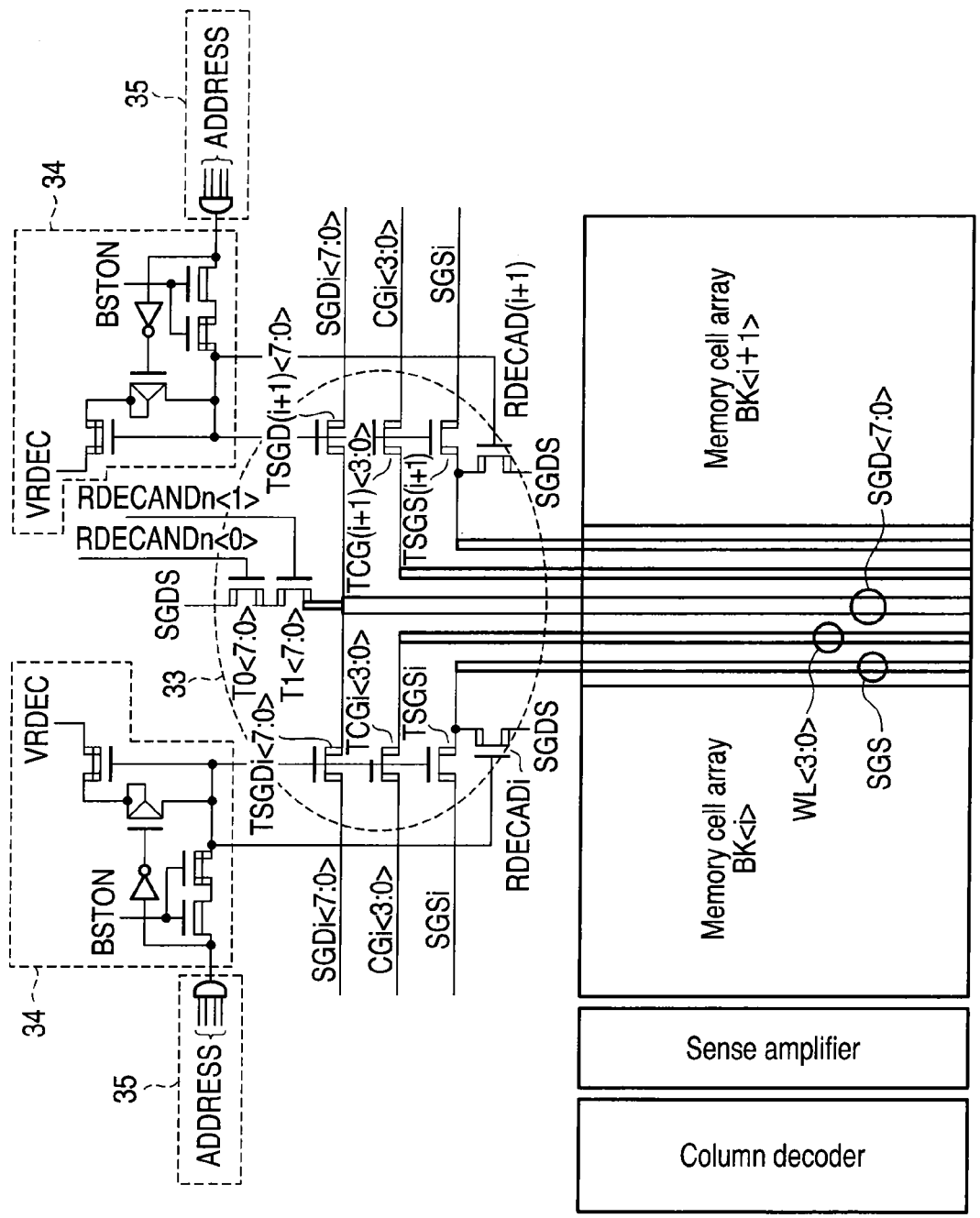
F I G. 18

THREE DIMENSIONAL STACKED NONVOLATILE SEMICONDUCTOR MEMORY

CROSS-REFERENCE TO RELATED APPLICATIONS

This application is a continuation of and claims the benefit of priority under 35 U.S.C. §120 from U.S. Ser. No. 13/281,591 filed Oct. 26, 2011, which is a continuation of U.S. Ser. No. 12/950,509 filed Nov. 19, 2010 (now U.S. Pat. No. 8,068,364 issued Nov. 29, 2011), which is a continuation of U.S. Ser. No. 12/406,524 filed Mar. 18, 2009 (now U.S. Pat. No. 7,852,675 issued Dec. 14, 2010), and claims the benefit of priority under 35 U.S.C. §119 from Japanese Patent Application No. 2008-112657 filed Apr. 23, 2008, the entire contents of each of which are incorporated herein by reference.

BACKGROUND OF THE INVENTION

1. Field of the Invention

The present invention relates to a three dimensional stacked nonvolatile semiconductor memory.

2. Description of the Related Art

BiCS (Bit Cost Scalable) technology is known as a technology for suppressing a bit cost of a semiconductor memory by increasing the capacity thereof by a three dimensional structure (refer to, for example, "Bit Cost Scalable Technology with Punch and Plug Process for Ultra High Density Flash Memory" 2007 Symposium on VLSI Technology Digest of Technical Papers. p. 14).

A nonvolatile semiconductor memory to which the BiCS technology is applied (hereinafter, called a BiCS memory) has a feature in that it not only has a three dimensional structure but makes bit cost scalability possible so that a bit cost can be reduced in proportion to an increase of the number of stacked layers by devising a device structure and a process technology.

In, for example, a NAND flash memory to which the BiCS technology is applied (hereinafter, called a BiCS-NAND flash memory), a memory capacity, which greatly exceeds the limit of the memory capacity of a NAND flash memory having a two-dimensional structure, can be realized by increasing the number of cells in a longitudinal direction which comprise a NAND column by increasing the number of stacked layers.

However, since the BiCS memory which is represented by a BiCS-NAND flash memory has a unique device structure, there are many problems to be solved to practically use the BiCS memory.

An increase of a peripheral circuit is exemplified as one of the problems.

In the BiCS memory, although a memory cell array is arranged as a three dimensional structure, a peripheral circuit is arranged as a two dimensional structure like a conventional structure. Further, select gate lines on a bit line side must be disposed in one block according to a memory cell array structure specific to the BiCS memory.

Accordingly, in the BiCS memory, the area of drivers for driving the select gate lines on the bit line side is increased by the number of the select gate lines in one block as compared with a nonvolatile semiconductor memory having a two dimensional structure in which it is only necessary to dispose one select gate line in one block.

BRIEF SUMMARY OF THE INVENTION

A three dimensional stacked nonvolatile semiconductor memory according to an aspect of the present invention comprises a semiconductor substrate, a memory cell array comprised of first and second blocks disposed on the semiconductor substrate side by side in a first direction, and a first driver disposed on one end of the memory cell array in a second direction orthogonal to the first direction.

Each of the first and second blocks is comprised of at least three conductive layers stacked on the semiconductor substrate by being insulated from each other, a bit line disposed on the at least three conductive layers by being insulated therefrom, and columnar semiconductors having lower ends connected to the semiconductor substrate and upper ends connected to the bit line and passing through the at least three conductive layers.

An uppermost layer of the at least three conductive layers is comprised of first select gate lines extending in the second direction, a lowermost layer of the at least three conductive layers is a second select gate line, remaining conductive layers excluding the uppermost layer and the lowermost layer of the at least three conductive layers are a word line, and remaining conductive layers excluding the uppermost layer of the at least three conductive layers have a plate shape whose width in the first direction is larger than the width in the first direction of the first select gate lines.

Select gate transistors are comprised of the first select gate lines and the columnar semiconductors, and the second select gate line and the columnar semiconductors, respectively and memory cells are comprised of the word line and the columnar semiconductor, respectively.

The first select gate lines in the first block and the first select gate lines in the second block are connected to the first driver after they are commonly connected in one end in the second direction of the memory cell array in a relation of one to one.

BRIEF DESCRIPTION OF THE SEVERAL VIEWS OF THE DRAWING

FIG. 1 is a bird's eye view of a BiCS-NAND flash memory;
FIG. 6 is a bird's eye view of the NAND cell unit;
FIG. 8 is a comparative view comparing a BiCS-NAND with a two-dimensional NAND;
FIG. 14 is a plan view when select gate lines shown in FIG. 13 are arranged as a device;
FIG. 15 is a conceptual view of a layout of a second embodiment;
FIG. 18 is a view showing a driver as a first comparative example.

DETAILED DESCRIPTION OF THE INVENTION

Figure 2:
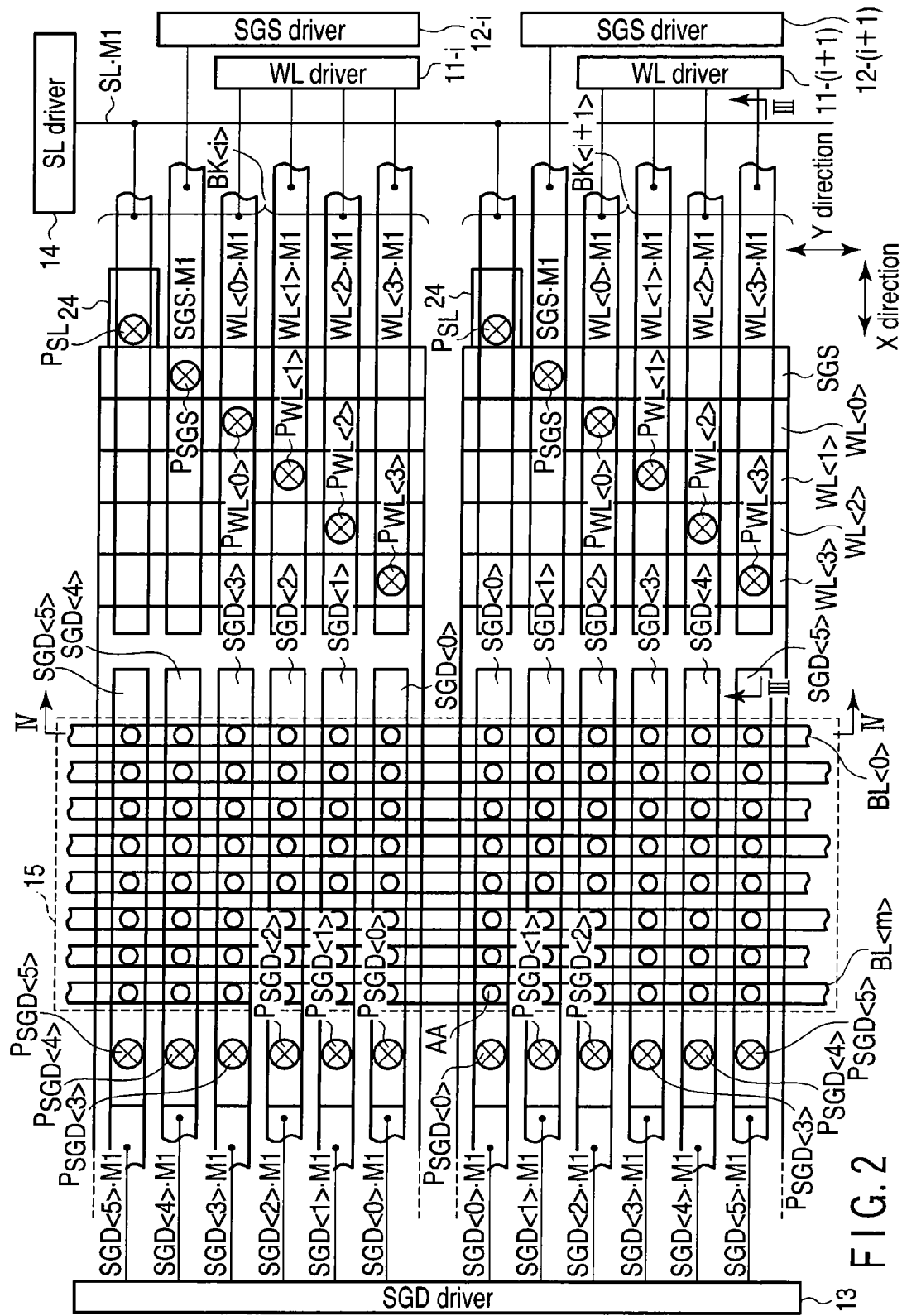
FIG. 2 is a plan view of the BiCS-NAND flash memory.

A three dimensional stacked nonvolatile semiconductor memory of an aspect of the present invention will be described below in detail with reference to the accompanying drawing.

1. Outline

Examples of the present invention propose a new layout of select gate lines on a bit line side, the layout being devised to suppress an increase of the area of a peripheral circuit caused by a structure specific to a BiCS memory, i.e., by that the select gate lines on the bit line side are disposed in one block.

When a feature of the BiCS memory is expressed simply from the viewpoint of a circuit, cell units are included in one block connected to one bit line. Accordingly, in a write operation and a read operation, one of the cell units in one block which are connected to the one bit line must be selected.

The selection is performed by a select gate line on the bit line side. That is, the number of the select gate lines on the bit line side in the one block is equal to that of the cell units in the one block connected to one bit line.

In the BiCS memory, a block can be selected by a word line and a select gate line on a source line side. Accordingly, it is not necessary to drive select gate lines on the bit line side in one block independently of select gate lines on the bit line side in other block.

In view of the above, the example of the present invention proposes a layout in which select gate lines on the bit line side in one of two blocks arranged side by side in a first direction and select gate lines on the bit line side in the other of the two blocks are connected to a driver after they are commonly connected in the relation of one to one.

As described above, since the select gate lines on the bit line side are shared by the two blocks, the number of transistors for driving them is reduced. As a result, the BiCS memory can be practically used by suppressing the increase of the area of the peripheral circuit which is the problem specific to the BiCS memory.

Note that the example of the present invention includes an example in which when a memory cell array is comprised of at least three blocks, select gate lines on a bit line side in the at least three blocks or in all the blocks are connected to a driver after they are commonly connected.

2. BiCS Memory (1) Basic Structure

First, a basic structure of a BiCS memory will be explained.

FIG. 1 shows a bird's eye view of a BiCS-NAND flash memory.

The NAND flash memory is comprised of blocks each of which acts, for example, as a unit to be erased. Here, two blocks BK<i>, BK<i+1> are shown in the figure.

A source diffusion layer 24 formed in a semiconductor substrate is shared by, for example, all the blocks. The source diffusion layer 24 is connected to a source line SL•M1 through a contact plug $P_{SL}$. Further, at least three conductive layers (in the example, six-layer structure) comprised of, for example, conductive polysilicon are laminated on the source diffusion layer 24.

The remaining five conductive layers excluding the uppermost layer are formed in a plate shape, respectively in the one block BK<i+1> as well as the ends thereof in the X-direction are formed stepwise so that they are in contact with the respective conductive layers. A lowermost layer acts as a select gate line SGS on the source line side, and the remaining four conductive layers excluding the lowermost and uppermost layers act as word lines WL<0>, WL<1>, WL<2>, and WL<3>.

The uppermost layer is comprised of line-shaped conductive wires extending in the X-direction. Six conductive wires, for example, are disposed in the one block BK<i+1>. The six conductive wires, for example, of the uppermost layer act as select gate lines SGD<0>, . . . , SGD<5> on a bit line side.

Active layers (active areas) AA for comprising a NAND cell unit are formed columnarly in a Z-direction (direction vertical to the front surface of the semiconductor substrate) so that they reach the source diffusion layer 24 passing through the conductive layers.

The upper ends of the active layers AA are connected to bit lines BL<0>, . . . , BL<m> extending in a Y-direction. Further, the select gate line SGS on the source line side is connected to an interconnect line SGS•M1 extending in the X-direction through a contact plug $P_{SGS}$, and the word lines WL<0>, WL<1>, WL<2>, and WL<3> are connected to interconnect lines WL<0>•M1, WL<1>•M1, WL<2>•M1, and WL<3>•M1 extending in the X-direction through contact plugs $P_{WL<0>}$, $P_{WL<1>}$, $P_{WL<2>}$, $P_{WL<3>}$, respectively.

Further, select gate lines SGD<0>, . . . , SGD<5> on the bit line side are connected to interconnect lines SGD<0>•M1, . . . , SGD<5>•M1 extending in the X-direction through contact plugs $P_{SGD<0>}$, . . . , $P_{SGD<5>}$, respectively.

The bit lines BL<0>, . . . , BL<m> and the interconnect lines SGS•M1, WL<0>•M1, WL<1>•M1, WL<2>•M1, and WL<3>•M1, SGD<0>•M1, . . . , SGD<5>•M1 are comprised of, for example, metal.

FIG. 2 shows a plan view of the BiCS-NAND flash memory of FIG. 1.

The columnar active layers AA are disposed in an array-state when viewed from the upper surface of the semiconductor substrate and comprise a memory cell array 15. Although the NAND cell unit is formed in each of the active layers AA, it will be described later in detail.

WL drivers 11-$i$ and 11($i$+1) are connected to the word lines WL<0>, WL<1>, WL<2>, and WL<3> through the interconnect lines WL<0>•M1, WL<1>•M1, WL<2>•M1, WL<3>•M1 and drive them in write, in read, and in erase.

SGS drivers 12-$i$ and 12-($i$+1) are connected to the select gate line SGS on the source line side through the interconnect line SGS•M1. A SGD driver 13 is connected to the select gate lines SGD<0>, . . . , SGD<5> on the bit line side through the interconnect lines SGD<0>•M1, . . . , SGD<5>•M1.

An SL driver 14 is connected to the source diffusion layer 24 through the source line SL•M1.

In this layout, the WL drivers 11-$i$ and 11-($i$+1) and the SGS drivers 12-$i$ and 12-($i$+1) are disposed on one end side of the memory cell array 15 in the X-direction, and the SGD driver 13 is disposed on the other end side of the memory cell array 15 in the X-direction in consideration of an increase of the number of transistors comprising the drivers as a peripheral circuit.

Figure 3:
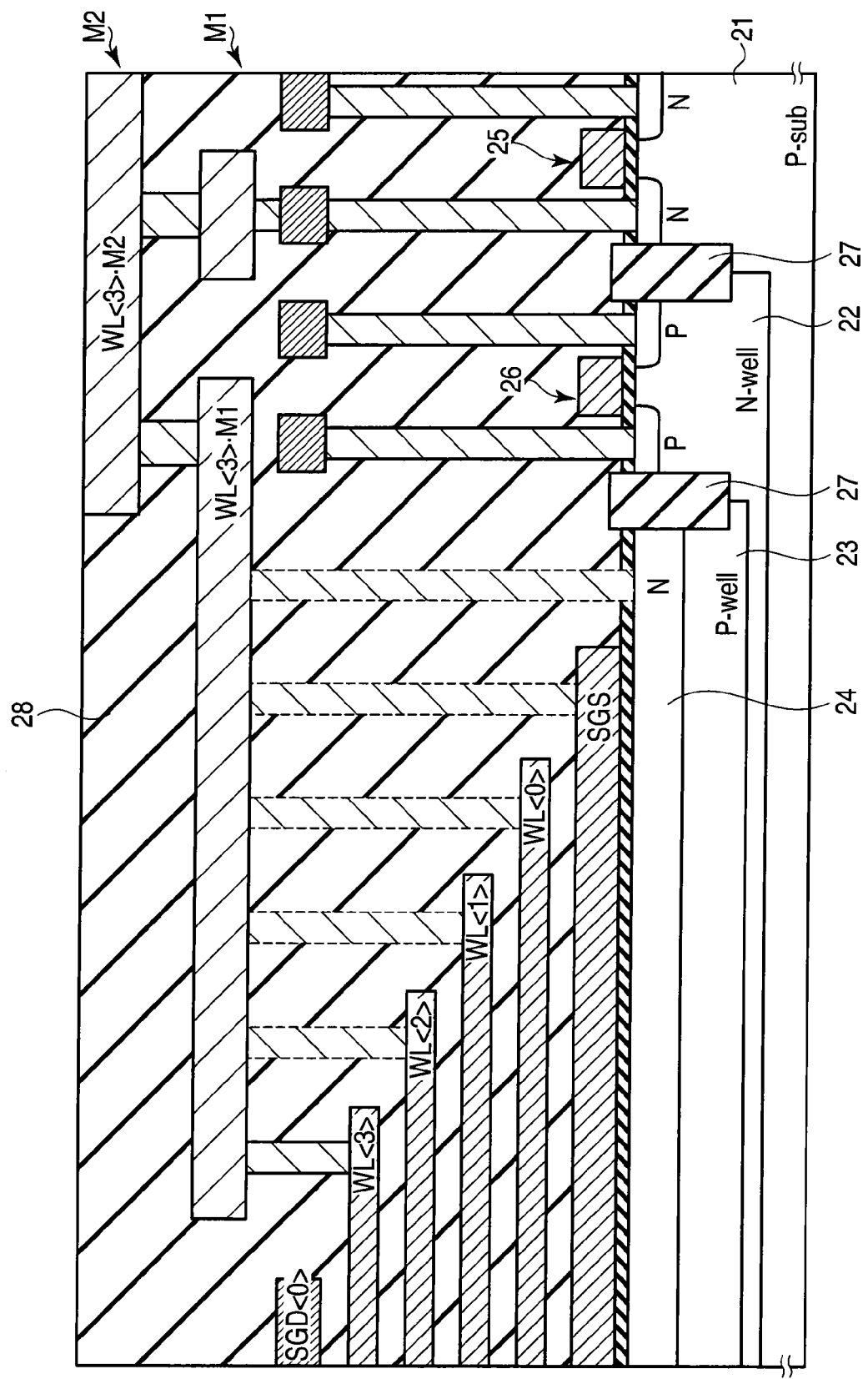
FIG. 3 is a sectional view taken along line III-III of FIG. 2.

FIG. 3 is a sectional view taken along line III-III of FIG. 2.

An N-type well region (N-well) 22 and a P-type well region (P-well) 23 are formed in a P-type semiconductor substrate (P-sub) 21. The source diffusion layer 24 is an N-type diffusion layer and formed in the P-type well region 23.

An N-channel FET (for example, N-channel MOSFET) 25 is formed in the P-type semiconductor substrate 21, and a P-channel FET (for example, P-channel MOSFET) 26 is formed in the N-type well region 22. These transistors comprise the peripheral circuit (for example, the drivers) formed in a peripheral portion of a memory cell array.

The select gate line SGS on the source line side and the word lines WL<0>, WL<1>, WL<2>, and WL<3> are connected to the transistors comprising the drivers through the interconnect line in a first metal layer M1 and through an interconnect line in a second metal layer M2 on the first metal layer M1.

To explain the word line WL<3> as an example, the word line WL<3> is connected to the N-channel FET 25 comprising a word line driver through the interconnect line WL<3>•M1 in the first metal layer M1 and through an interconnect line WL<3>•M2 in the second metal layer M2 on the first metal layer M1.

Here, gate electrodes of the N-channel FET 25 and the P-channel FET 26 are formed simultaneously with, for example, the select gate line SGS on the source line side.

That is, the gate electrodes of the N-channel FET 25 and the P-channel FET 26 have the same structure and the same thickness as those of the select gate line SGS on the source line side.

Figure 4:
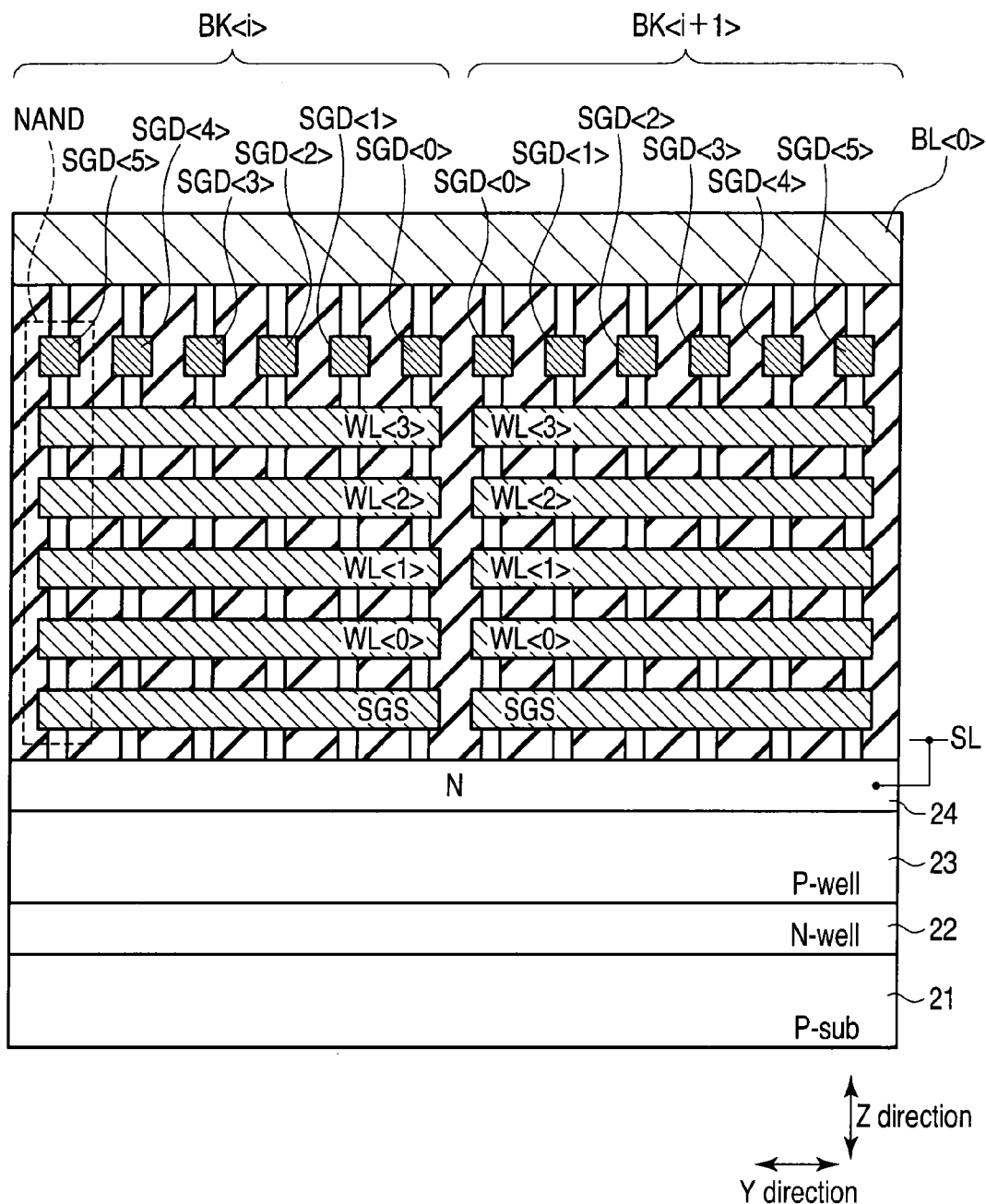
FIG. 4 is a sectional view taken along line IV-IV of FIG. 2.

FIG. 4 is a sectional view taken along line IV-IV of FIG. 2.

One ends (lowermost portions) of the active layers (active areas) AA are connected to the source diffusion layer 24 passing through the select gate line SGS on the source line side, the word lines WL<0>, WL<1>, WL<2>, and WL<3>, and the select gate lines SGD<0>, . . . , SGD<5> on the bit line side, and the other ends (uppermost portions) thereof are connected to a bit line BL<0>.

The active layers AA are formed columnarly in the Z-direction (direction vertical to the front surface of the semiconductor substrate), and the NAND cell unit NAND is formed in each of the active layers AA.

Figure 5:
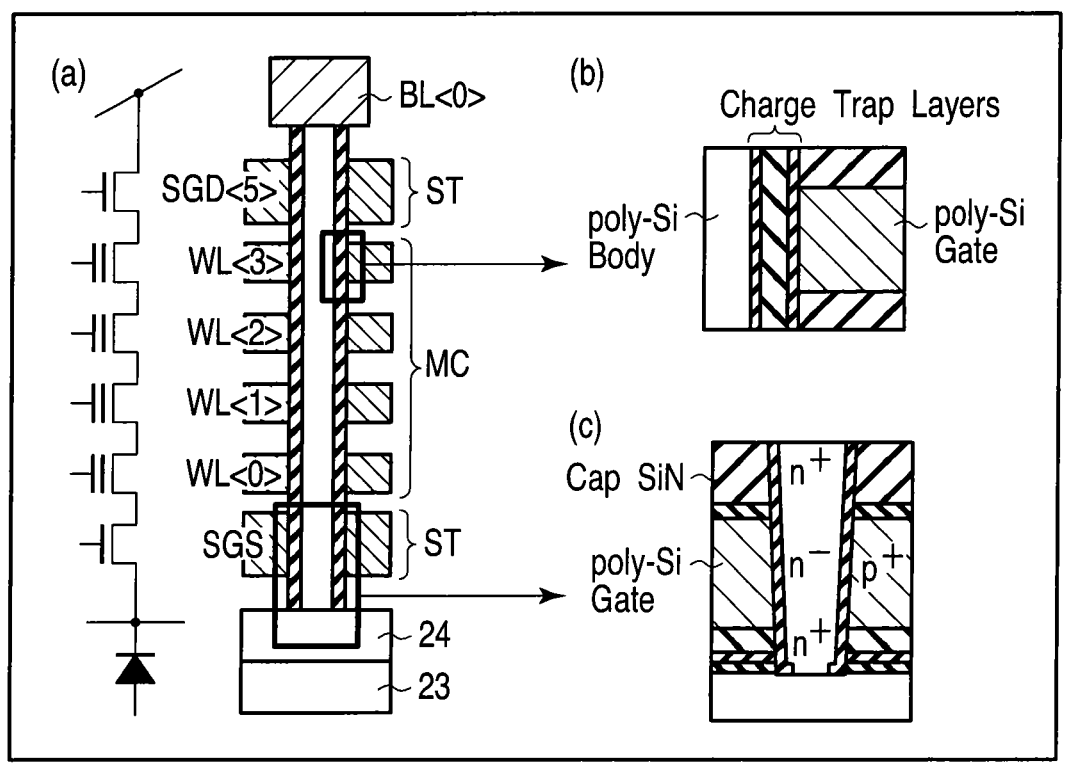
FIG. 5 is a structure view of a NAND cell unit.

FIG. 5 shows an example of a structure of the NAND cell unit NAND.

A memory cell MC has a MONOS structure.

The MONOS structure means a memory cell structure having a charge accumulation layer comprised of an insulation material such as nitride. The charge accumulation layer has a multilayer structure (charge trap layers), and ONO (oxide/nitride/oxide) is exemplified here.

A select gate transistor ST has the same structure as that of, for example, the memory cell MC.

However, a gate insulation film of the select gate transistor ST may have a structure different from that of the memory cell MC, i.e., may have a structure that includes no charge accumulation layer (for example, a single silicon oxide film).

FIG. 6 shows a bird's eye view of the NAND cell unit.

One of the features of the NAND cell unit having a three dimensional structure resides in that each of the select gate line SGS on the source line side, the word lines WL<0>, WL<1>, WL<2>, and WL<3>, and the select gate lines SGD<0>, . . . , SGD<5> on the bit line side has a structure for surrounding each of the side surfaces of the columnar active layers AA.

Accordingly, even if the active layers AA are made, for example, thinner and a larger number of the active layers AA are formed on the semiconductor substrate to increase a capacity, a force for driving the transistors comprising the NAND cell unit can be sufficiently secured.

Figure 7:
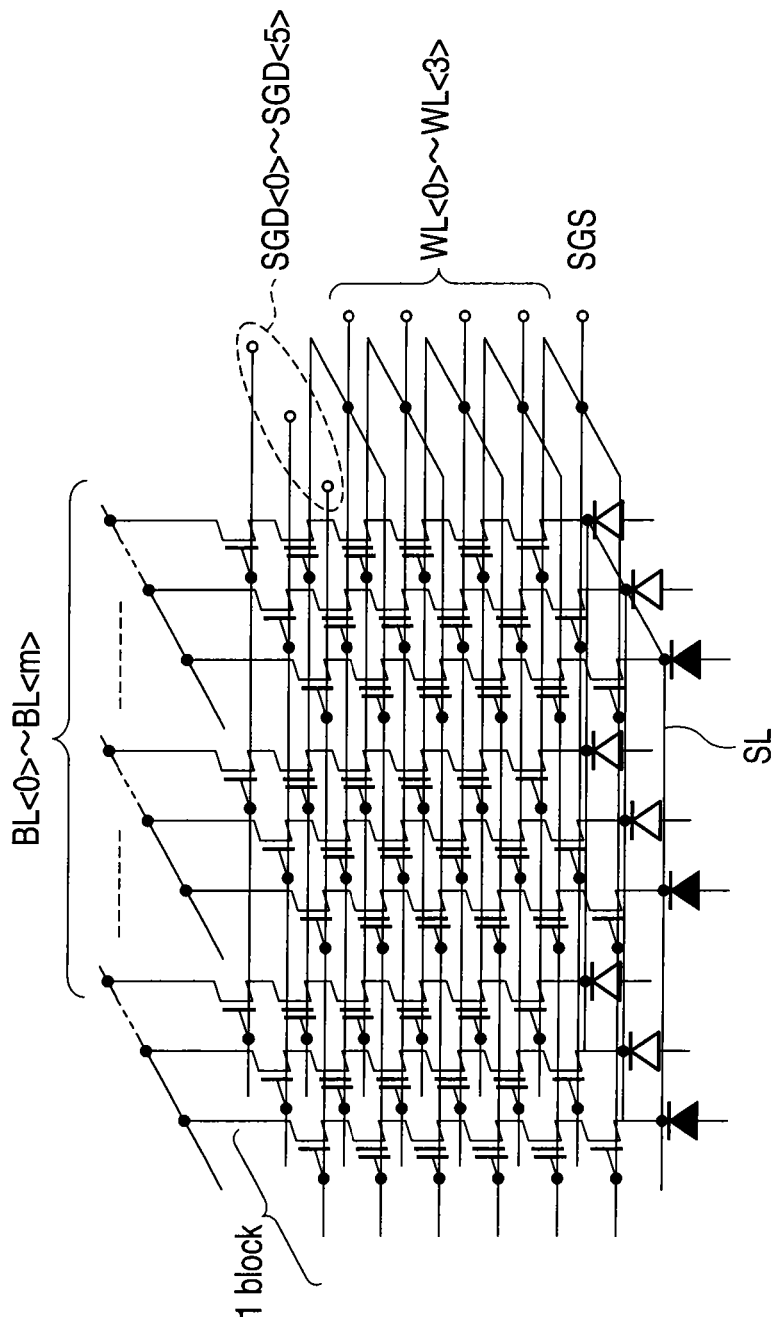
FIG. 7 is an equivalent circuit view of a memory cell array.

FIG. 7 shows an equivalent circuit of the memory cell array.

Since the BiCS-NAND flash memory has a three dimensional structure, the equivalent circuit is shown in a three dimension.

A larger number of memory cells comprising a NAND column can more contribute to an increase of the capacity. However, as the number of the memory cells comprising the NAND column is more increased, there is a possibility that the characteristics of the memory cells are dispersed in a manufacturing process from the characteristics of a BiCS structure.

When the dispersion of the characteristics is taken into consideration, the NAND column is comprised of a smaller number of the memory cells (for example, four memory cells, eight memory cells, and the like). Further, the same structure may be stacked on a structure shown by the equivalent circuit of FIG. 7.

FIG. 8 is a view showing BiCS-NAND in comparison with two-dimensional NAND.

In the NAND flash memory having the two-dimensional structure (two-dimensional NAND), one NAND cell unit in one block is connected to one bit line BL, whereas in the BiCS-NAND, NAND cell units in one block are connected to one bit line BL.

Accordingly, as explained below, one of the cell units in the one block connected to the one bit line BL is selected by the select gate lines SGD<0>, . . . , SGD<5> on the bit line side in a write operation and a read operation.

(2) Basic Operations

Basic operations of the BiCS-NAND flash memory of FIGS. 1 to 8 will be explained.

Since the basic write, read, and erase operations are the same as those of the NAND flash memory having the two-dimensional structure, matters specific to the BiCS-NAND flash memory will be explained here.

The concept of one block of the BiCS-NAND flash memory is different from that of the NAND flash memory having the two-dimensional structure.

Although the one NAND cell unit in the one block is connected to the one bit line BL in the NAND flash memory having the two-dimensional structure, the NAND cell units in the one block are connected to the one bit line BL in the BiCS-NAND flash memory.

For example, in the plan view of FIG. 2, six NAND cell units (corresponding to the number of the active layers AA in the figure) in the block BK<i+1> are connected to the bit line BL<0>.

Accordingly, in the write operation and the read operation, one of the six NAND cell units in the block BK<i+1> connected to the bit line BL<0> must be selected.

The selection is performed by select gate lines SGD<0>, . . . , SGD<5> on the bit line side. The select gate lines SGD<0>, . . . , SGD<5> on the bit line side are individually connected to six NAND cell units in the Y-direction in the block BK<i+1>.

The erase operation is performed collectively to, for example, all the memory cells in one block like the NAND flash memory having the two-dimensional structure.

The BiCS-NAND flash memory can be applied to both a binary memory, which stores binary data in one memory cell, and a multi-level memory which stores multi-level data having a ternary or more value in one memory cell.

3. Embodiments

Embodiments of the present invention will be explained.

(1) Block Layout

Figure 9:
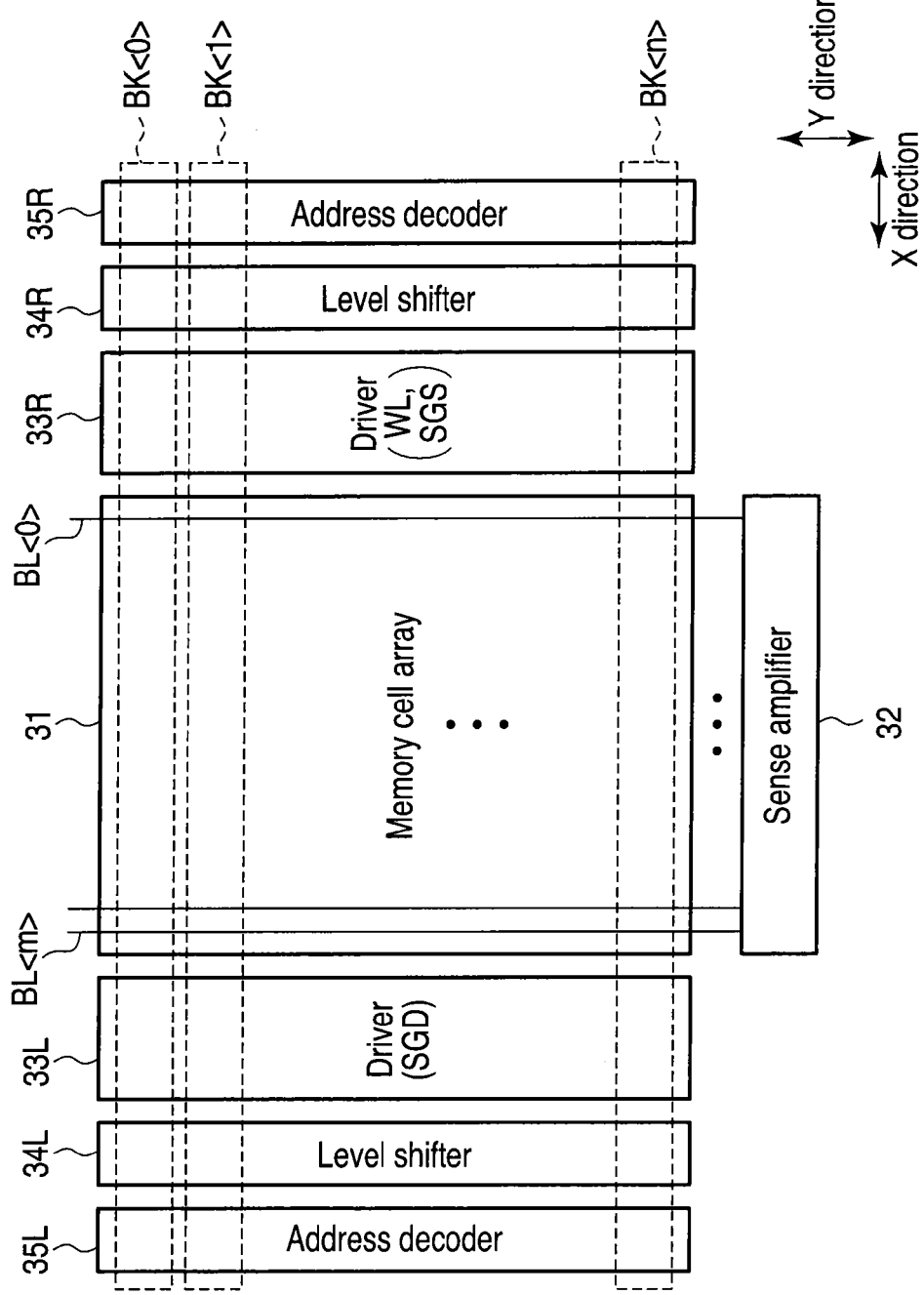
FIG. 9 is a view showing a first example of a block layout.

FIG. 9 shows a first example of a block layout of a BiCS memory.

The block layout corresponds to, for example, the BiCS-NAND flash memory of FIG. 1 and has a feature in that a select gate line driver on a bit line side is disposed on one end of a memory cell array and a word line driver and a select gate line driver on a source line side are disposed on the other end of the memory cell array.

A driver 33L, a level shifter 34L, and an address decoder 35L are disposed on one end of the memory cell array 31 in the X-direction (on a left side). The driver 33L is a driver for driving a select gate line SGD on the bit line side and includes a transfer transistor.

A driver 33R, a level shifter 34R, and an address decoder 35R are disposed on the other end of the memory cell array 31 in the X-direction (on a right side). The driver 33R is a driver for driving a word line WL and a select gate line SGS on the source line side and includes a transfer transistor.

Further, a sense amplifier 32 is disposed on one end of the memory cell array 31 in the Y-direction. Bit lines BL<0>, ..., BL<m> extending in the Y-direction are disposed on the memory cell array 31 and connected to the sense amplifier 32.

Since the block layout corresponds to the BiCS-NAND flash memory of FIG. 1, the select gate lines SGD on the bit line side are disposed in blocks BK<0>, BL<1>, ..., BK<n>, respectively. That is, since the area of the driver for driving the select gate lines SGD on the bit line side is increased, a select gate line driver on the bit line side is disposed on the one end of the memory cell array 31 in addition to the word line driver and the select gate line driver on the source line side disposed on the other end of the memory cell array 31.

Figure 10:
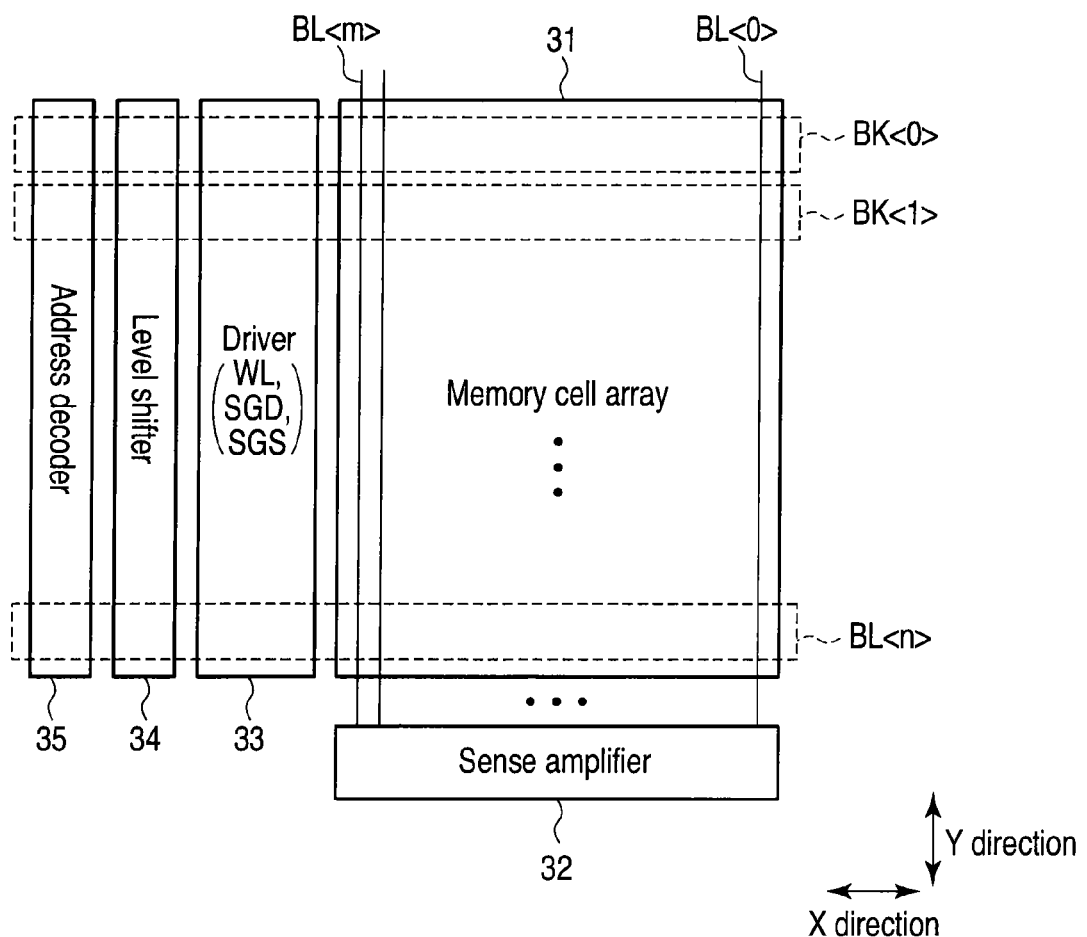
FIG. 10 is a view showing a second example of the block layout.

FIG. 10 shows a second example of the block layout of the BiCS memory.

A feature of the second example resides in that drivers 33 for driving a word line WL, a select gate line SGS on a source line side, and a select gate line SGD on a bit line side are disposed together on one end of a memory cell array 31 in comparison with the first example.

The drivers 33, a level shifter 34, and an address decoder 35 are disposed on one end of the memory cell array 31 in the X-direction (on a left side). The drivers 33 are drivers for driving the word line WL, the select gate line SGS on the source line side, and the select gate line SGD on the bit line side and include transfer transistors.

Further, a sense amplifier 32 is disposed on one end of the memory cell array 31 in the Y-direction. Bit lines BL<0>, ..., BL<m> extending in the Y-direction are disposed on the memory cell array 31 and connected to the sense amplifier 32.

Since the drivers 33 for driving the word line WL, the select gate line SGS on the source line side and the select gate line SGD on the bit line side are disposed together as described above, an address decoder 34 and a level shifter 35 can be also disposed together at the same position. As a result, a layout of a peripheral circuit can be made efficiently.

However, in the above block layout, when the size of the memory cell array 31 is increased and further a memory cell is miniaturized and the word line WL, the select gate line SGS on the source line side and the select gate line SGD on the bit line side are disposed at narrow pitches, a problem arises in that a signal is delayed by a parasitic capacitance.

In particular, in the BiCS memory, the word line WL and the select gate line SGS on the source line side are formed in a plate shape. Accordingly, coupling noise is caused by an increase of a parasitic capacitance between the conductive wires.

Figure 11:
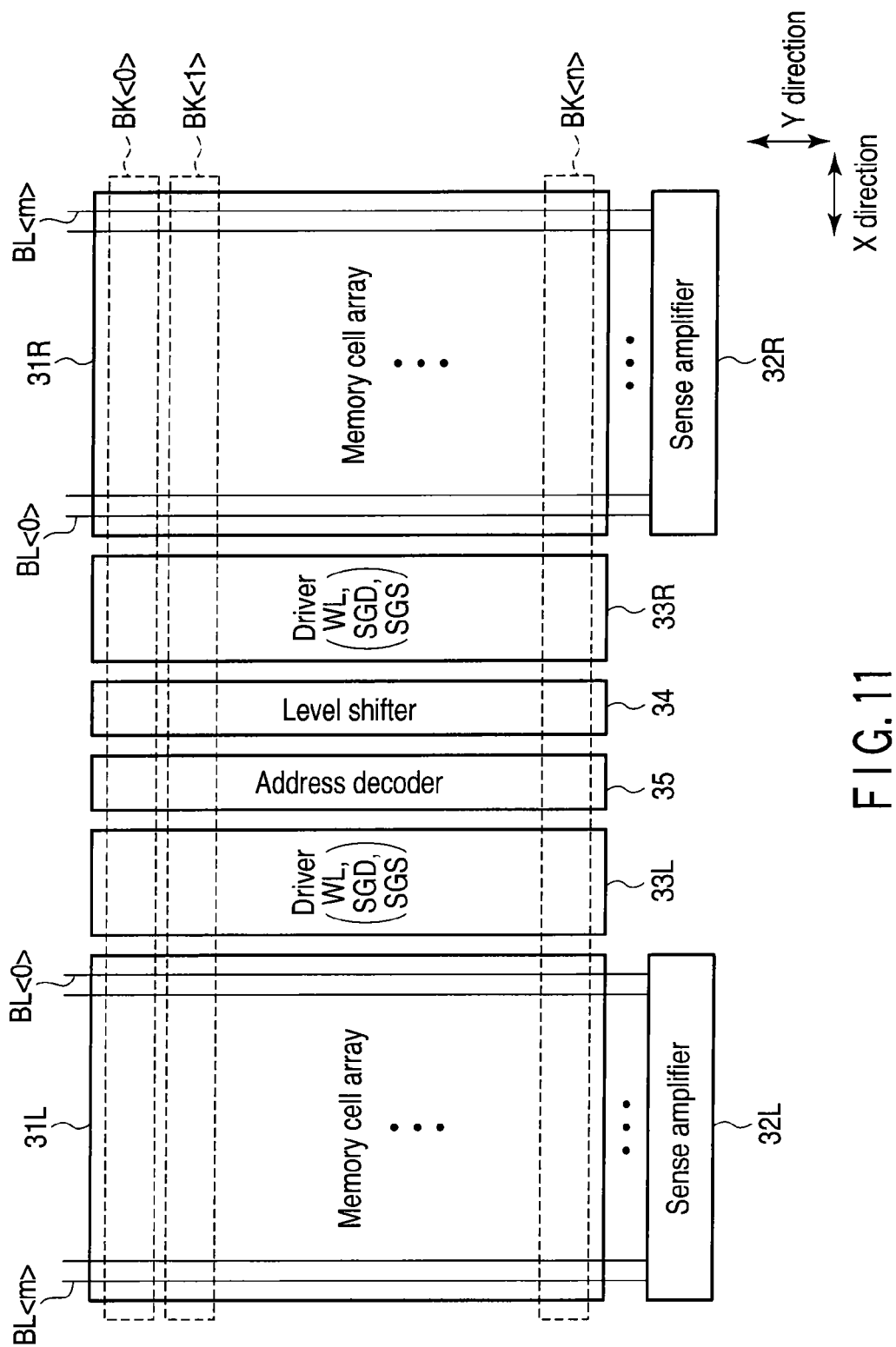
FIG. 11 is a view showing a third example of the block layout.

FIG. 11 shows a third example of the block layout of the BiCS memory.

A feature of the third example resides in that two memory cell arrays 31L and 31R are disposed in comparison with the second example. Since disposition of the two memory cell arrays 31L and 31R can reduce the lengths of a word line WL, a select gate line SGS on a source line side, and a select gate line SGD on a bit line side in each memory cell array, a signal delay and coupling noise can be suppressed.

The memory cell arrays 31L and 31R are disposed in the X-direction side by side. Drivers 33L and 33R, a level shifter 34, and an address decoder 35 are interposed between the memory cell arrays 31L and 31R. The drivers 33L and 33R drive the word line WL, the select gate line SGS on the source line side, and the select gate line SGD on the bit line side and include transfer transistors.

Further, sense amplifiers 32L and 32R are disposed on one ends of the memory cell arrays 31L and 31R in the Y-direction. Bit lines BL<0>, ..., BL<m> extending in the Y-direction are disposed on the memory cell arrays 31L and 31R and connected to the sense amplifiers 32L and 32R.

Although the level shifter 34 and the address decoder 35 are shared by the two memory cell arrays 31L and 31R in the block layout, the driver 33L is disposed in correspondence with the memory cell array 31L, and the driver 33R is disposed in correspondence with the memory cell array 31R.

A reason why the drivers 33L and 33R cannot be shared by the two memory cell arrays 31L and 31R as described above is that since the drivers are comprised of a lot of transistors, when they are shared by the memory cell arrays 31L and 31R, a layout of wirings for connecting the memory cell arrays 31L and 31R to the drivers 33L and 33R is made complex. That is, when a driver is disposed on each memory cell array, a layout of wirings is more simplified than a case that the drivers are shared by the two memory cell arrays.

Figure 12:
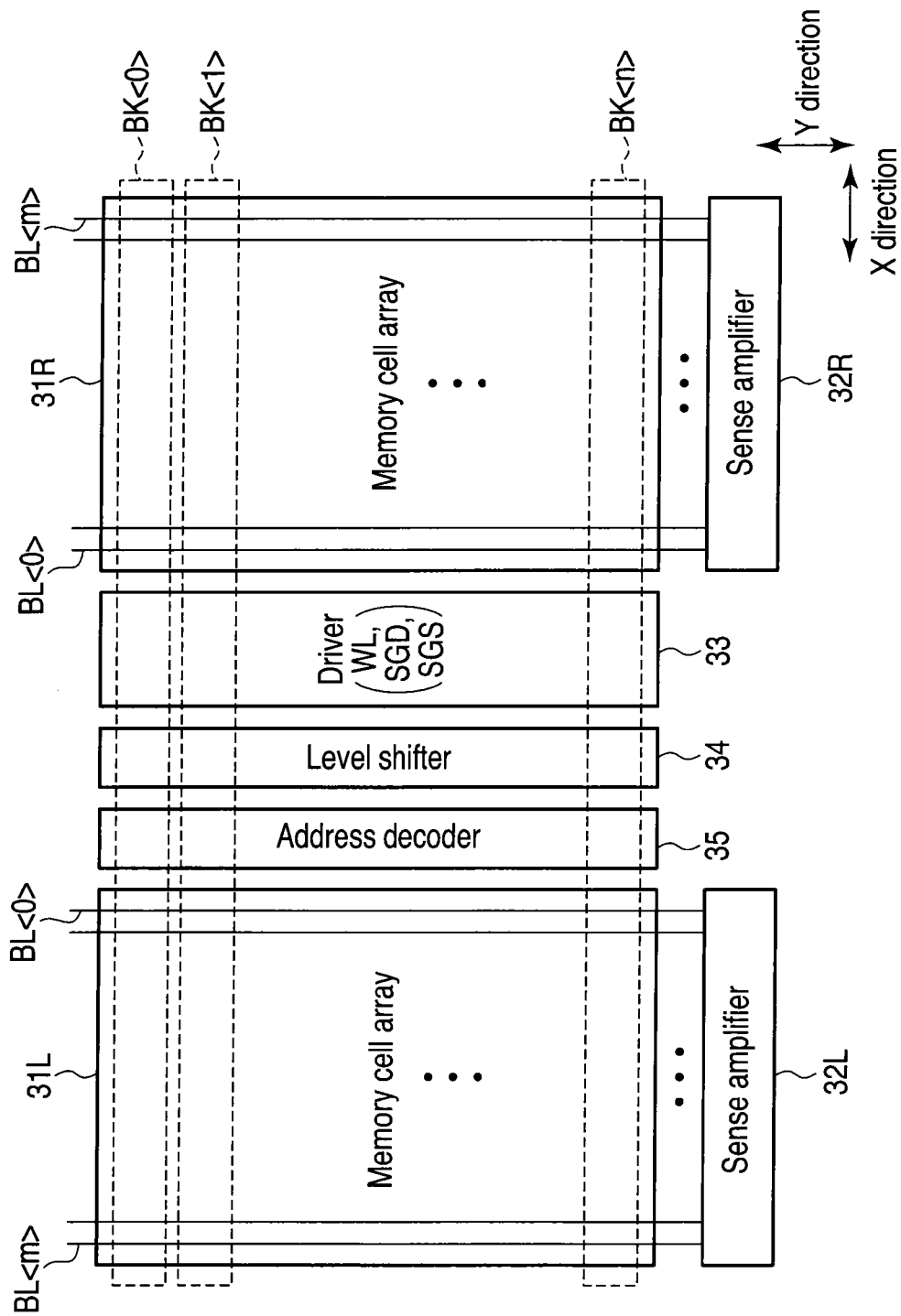
FIG. 12 is a view showing a fourth example of the block layout.

FIG. 12 shows a fourth example of the block layout of the BiCS memory.

A feature of the fourth example resides in that a driver 33 for driving a word line WL, a select gate line SGS on a source line side, and a select gate line SGD on a bit line side is shared by two memory cell arrays 31L and 31R in comparison with the third example.

The driver 33 can be shared by reducing the area thereof, i.e., by reducing the number of transistors comprising the driver 33. More specifically, this is because a layout of wirings for connecting the memory cell arrays 31L and 31R to the driver 33 is not made complex by reducing the number of the transistors. Although the number of the transistors comprising the driver 33 is reduced by a layout of the select gate line on the bit line side according to the present invention, this will be described later and only the block layout will be explained here.

The memory cell arrays 31L and 31R are disposed in the X-direction side by side. The driver 33, a level shifter 34, and an address decoder 35 are interposed between the memory cell arrays 31L and 31R. The driver 33 drives the word line WL, the select gate line SGS on the source line side and the select gate line SGD on the bit line side and includes a transfer transistor.

Further, sense amplifiers 32L and 32R are disposed on one ends of the memory cell arrays 31L and 31R in the Y-direction. Bit lines BL<0>, ..., BL<m> extending in the Y-direction are disposed on the memory cell arrays 31L and 31R and connected to the sense amplifiers 32L and 32R.

In the block layout, the driver 33, the level shifter 34, and the address decoder 35 are shared by the two memory cell arrays 31L and 31R.

Note that if the driver 33 can be shared by the two memory cell arrays 31L and 31R without making a wiring layout complex, the block layout of the fourth example will be most preferable in the first to fourth examples.

(2) Layout of Select Gate Line on Bit Line Side

A layout of a select gate line on a bit line side according to an example of the present invention will be explained.

A. First Embodiment

Figure 13:
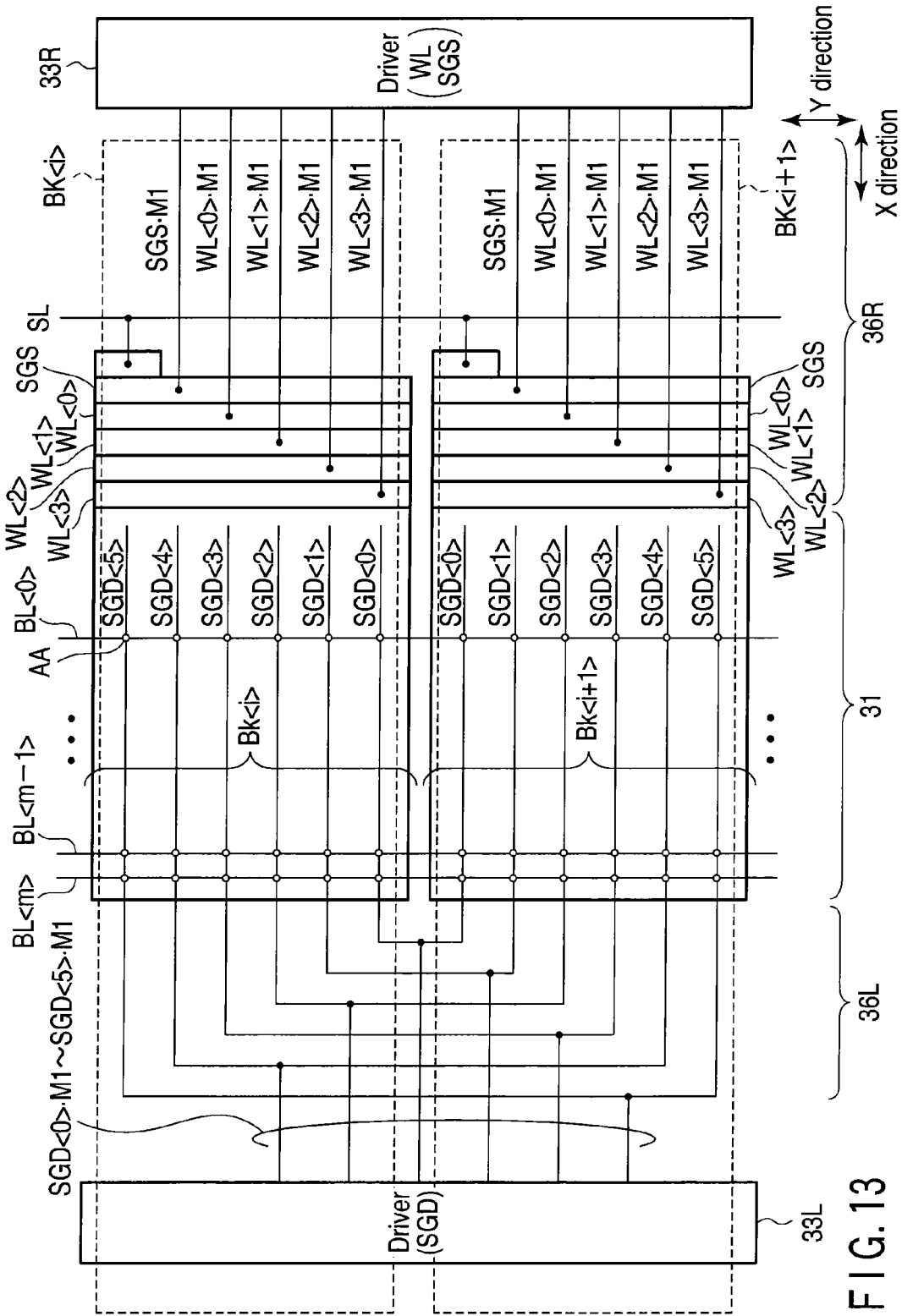
FIG. 13 is a conceptual view of a layout of a first embodiment.

FIG. 13 shows a conceptual view of a layout of a first embodiment. FIG. 14 shows a plane layout when the conceptual view of FIG. 13 is specifically arranged as a device.

The first embodiment corresponds to the block layout of FIG. 9. That is, a driver 33L connected to select gate lines SGD<0>, . . . , SGD<5> on a bit line side is disposed on one end (left side) of a memory cell array 31 in the X-direction as well as disposed independently of a driver 33R connected to word lines WL<0>, . . . , WL<3> and to a select gate line SGS on a source line side.

Each of two blocks BK<i>, BK<i+1> is comprised of at least three conductive layers, which are insulated from each other and stacked on a semiconductor substrate, bit lines BL<0>, . . . , BL<m>, which are insulated from the at least three conductive layers and disposed thereon, and active layers (columnar semiconductors) AA whose lower ends are connected to the semiconductor substrate, whose upper ends are connected to the bit lines BL<0>, . . . , BL<m>, and which pass through the at least three conductive layers.

The uppermost layer of the at least three conductive layers is comprised of the select gate lines SGD<0>, . . . , SGD<5> on the bit line side, the lowermost layer of the at least three conductive layers is the select gate line SGS on the source line side, and the remaining conductive layers excluding the uppermost and lowermost layers of the at least three conductive layers are the word lines WL<0>, . . . , WL<3>.

In the first example, although the number of the select gate lines SGD<0>, . . . , SGD<5> on the bit line side is six and the number of the word lines WL<0>, . . . , WL<3> is four in one block, respectively, the numbers are not limited thereto. That is, it is sufficient that the number of the select gate lines on the bit line side and the number of the word lines be at least one in the one block, respectively.

Further, the remaining conductive layers excluding the uppermost layer of the at least three conductive layers have a plate shape whose width in the Y-direction is larger than that in the Y-direction of the select gate lines SGD<0>, . . . , SGD<5> on the bit line side.

Select gate transistors on the bit line side are comprised of the select gate lines SGD<0>, . . . , SGD<5> on the bit line side and the active layers AA, and select gate transistors on the source line side are comprised of the select gate line SGS on the source line side and the active layers AA. Further, memory cells are comprised of the word lines WL<0>, . . . , WL<3> and the active layers AA.

Further, the region between the memory cell array 31 and the driver 33L is arranged as an interconnect portion 36L in which interconnect lines (conductive wires) SGD<0>•M1, . . . , SGD<5>•M1 are disposed to connect the memory cell array 31 to the driver 33L. Likewise, the region between the memory cell array 31 and the driver 33R is arranged as an interconnect portion 36R in which interconnect lines (conductive wires) WL<0>•M1, . . . , WL<3>•M1, and SGS•M1 are disposed to connect the memory cell array 31 to the driver 33R.

The select gate lines SGD<0>, . . . , SGD<5> on the bit line side in the block BK<i> and the select gate lines SGD<0>, . . . , SGD<5> on the bit line side in the block BK<i+1> are connected to the driver 33L after they are commonly con-nected in the relation of one to one in one end in the X-direction of the memory cell array 31.

Specifically, an i-th (i is a natural number) select gate line on the bit line side from the block BK<i+1> side of the select gate lines SGD<0>, . . . , SGD<5> on the bit line side in the block BK<i> is commonly connected to an i-th select gate line on the bit line side from the block BK<i> side of the select gate lines SGD<0>, . . . , SGD<5> on the bit line side in the block BK<i+1>.

Accordingly, the select gate lines SGD<0>, . . . , SGD<5> on the bit line side have a folded layout in their entirety.

The folded layout can be easily formed by making use of, for example, a side wall masking technology for etching a ground layer using a side wall as a mask.

In the first embodiment, since the select gate lines SGD<0>, . . . , SGD<5> on the bit line side in the two blocks, which are disposed in the Y-direction side by side, are commonly connected in the relation of one to one, the area of the driver 33L for driving them is also reduced. Accordingly, since the area of the peripheral circuit is reduced, the first embodiment can contribute to the practical use of the BiCS memory.

In this case, although the same signal is applied to the two blocks BK<i>, BK<i+1> as to the select gate lines SGD<0>, . . . , SGD<5> on the bit line side, no problem arises because a block can be selected by the word lines WL<0>, . . . , WL<3> and the select gate line SGS on the source line side as described already.

Note that how much area of the driver can be reduced as compared with the circuit example of the driver and a conventional circuit will be explained in the paragraph of advantages described later.

In the first embodiment, although the two blocks BK<i>, BK<i+1> are disposed adjacent to each other, other block may be interposed therebetween. Further, although the select gate lines on the bit line side are shared by the two blocks BK<i>, BK<i+1>, the select gate lines on the bit line side may be shared by at least three blocks or by all the blocks in the memory cell array.

B. Second Embodiment

Figure 16:
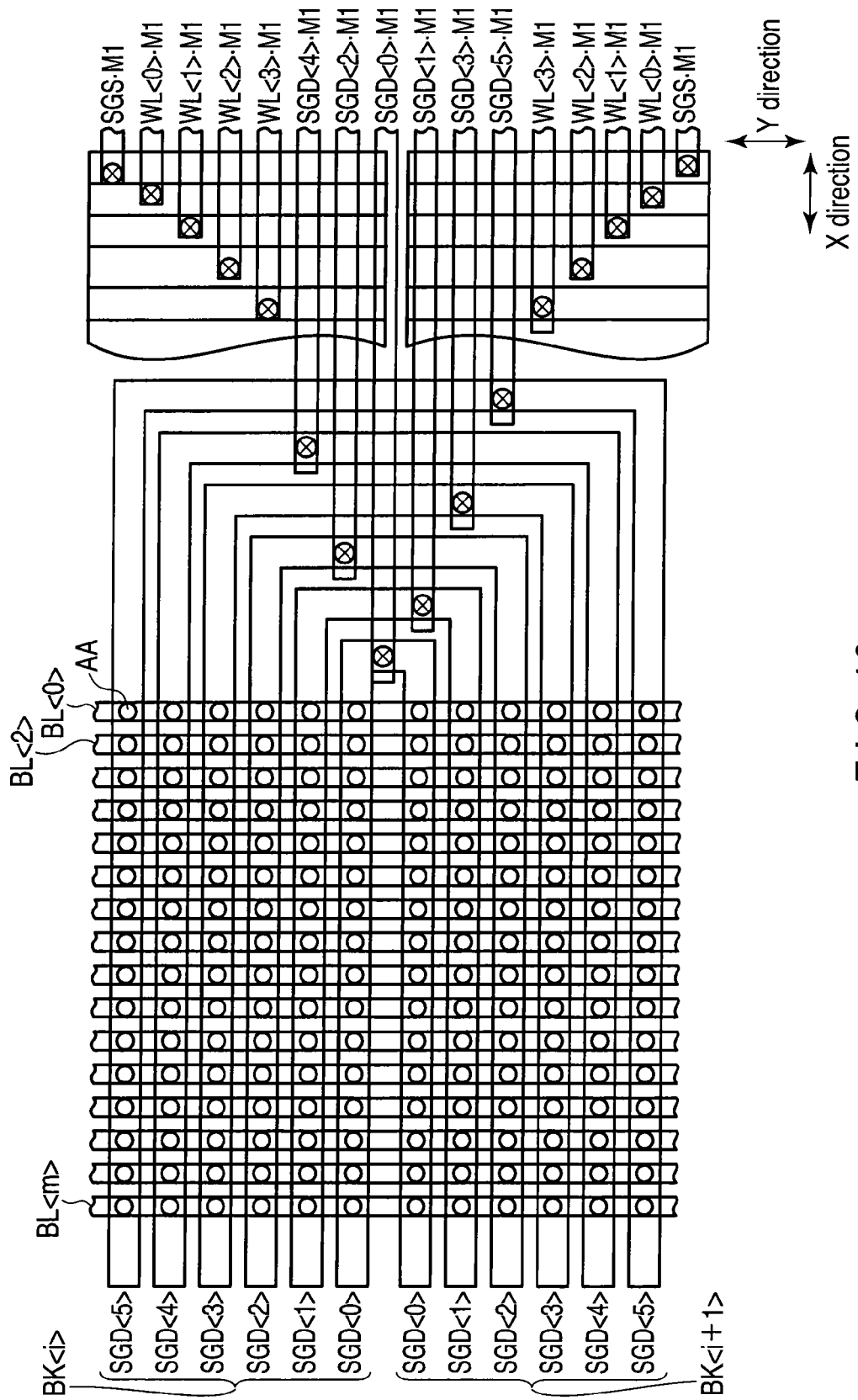
FIG. 16 is a plan view when select gate lines shown in FIG. 15 are arranged as a device.

FIG. 15 shows a conceptual view of a layout of a second embodiment. FIG. 16 shows a plane layout when the conceptual view of FIG. 15 is specifically arranged as a device.

The second embodiment corresponds to the block layout of FIGS. 10 to 12. That is, a driver 33 (33L and 33R) disposed on one end (right side) of a memory cell array 31 in the X-direction are connected to word lines WL<0>, . . . , WL<3>, a select gate line SGS on a source line side, and select gate lines SGD<0> . . . , SGD<5> on a bit line side.

Attention must be paid to the fact that the portions, to which the layouts of FIGS. 15 and 16 are applied as they are, are limited to the portion between the memory cell array 31L and the driver 33L of FIG. 11 and to the portion between the memory cell array 31L and the driver 33 of FIG. 12.

The layouts, which are obtained by reversing the layouts of FIGS. 15 and 16 in a right to left direction, are applied to the remaining portions between the memory cell array 31 and the driver 33 of FIG. 10, between the memory cell array 31R and the driver 33R of FIG. 11, and between the memory cell array 31R and the driver 33 of FIG. 12.

Each of two blocks BK<i>, BK<i+1> is comprised of at least three conductive layers, which are insulated from each other and stacked on a semiconductor substrate, bit lines BL<0>, . . . , BL<m>, which are insulated from the at least three conductive layers and disposed thereon, and active layers (columnar semiconductors) AA whose lower ends are connected to the semiconductor substrate, whose upper ends are connected to the bit lines BL<0>, ..., BL<m>, and which pass through the at least three conductive layers.

The uppermost layer of the at least three conductive layers is comprised of the select gate lines SGD<0>, ..., SGD<5> on the bit line side, the lowermost layer of the at least three conductive layers is a select gate line SGS on the source line side, and the remaining conductive layers excluding the uppermost and lowermost layers of the at least three conductive layers are the word lines WL<0>, ..., WL<3>.

In the second example, although the number of the select gate lines SGD<0>, ..., SGD<5> on the bit line side is six and the number of the word lines WL<0>, ..., WL<3> is four in one block, respectively, the numbers are not limited thereto. That is, it is sufficient that the number of the select gate lines on the bit line side and the number of the word lines be at least one in the one block, respectively.

Further, the remaining conductive layers excluding the uppermost layer of the at least three conductive layers have a plate shape whose width in the Y-direction is larger than the width in the Y-direction of the select gate lines SGD<0>, ..., SGD<5> on the bit line side.

Select gate transistors on the bit line side are comprised of the select gate lines SGD<0>, ..., SGD<5> on the bit line side and the active layers AA, and select gate transistors on the source line side are comprised of the select gate line SGS on the source line side and the active layers AA. Further, memory cells are comprised of the word lines WL<0>, ..., WL<3> and the active layers AA.

Further, the region between the memory cell array 31 (31L and 31R) and the driver 33L (33L and 33R) is arranged as an interconnect portion 36 in which interconnect lines (conductive wires) WL<0>•M1, ..., WL<3>•M1, SGS•M1, SGD<0>•M1, ..., SGD<5>•M1 are disposed to connect the memory cell array 31 to the driver 33.

The select gate lines SGD<0>, ..., SGD<5> on the bit line side in the block BK<i> and the select gate lines SGD<0>, ..., SGD<5> on the bit line side in the block BK<i+1> are connected to the driver 33 (33L and 33R) after they are commonly connected in the relation of one to one in one end in the X-direction (right side) of the memory cell array 31.

Specifically, an i-th (i is a natural number) select gate line on the bit line side from the block BK<i+1> side of the select gate lines SGD<0>, ..., SGD<5> on the bit line side in the block BK<i> is commonly connected to an i-th select gate line on the bit line side from the block BK<i> side of the select gate lines SGD<0>, ..., SGD<5> on the bit line side in the block BK<i+1>.

Accordingly, the select gate lines SGD<0>, ..., SGD<5> on the bit line side have a folded layout in their entirety.

The folded layout can be easily formed by making use of, for example, a side wall masking technology for etching a ground layer using a side wall as a mask.

In the second embodiment, since the select gate lines SGD<0>, ..., SGD<5> on the bit line side in the two blocks, which are disposed in the Y-direction side by side, are commonly connected in the relation of one to one, the area of the driver 33 (33L, 33R) for driving them is also reduced. Accordingly, since the area of the peripheral circuit is reduced, the second embodiment can contribute to the practical use of the BiCS memory.

In this case, although the same signal is applied to the two blocks BK<i>, BK<i+1> as to the select gate lines SGD<0>, ..., SGD<5> on the bit line side, no problem arises because a block can be selected by the word lines WL<0>, ..., WL<3> and the select gate line SGS on the source line side as described already.

Further, in the second embodiment, the number of the interconnect lines WL<0>•M1, ..., WL<3>•M1, SGS•M1, SGD<0>•M1, ..., SGD<5>•M1 disposed on one end of the memory cell array 31 (31L, 31R) is increased. However, since it is sufficient that these interconnect lines be accommodated within the range of the size of the two blocks BK<i>, BK<i+1> in the Y-direction, a layout of the interconnect lines WL<0>•M1, ..., WL<3>•M1, SGS•M1, SGD<0>•M1, ..., SGD<5>•M1 is not made complex.

Note that how much area of the driver can be reduced as compared with the circuit example of the driver and a conventional circuit will be explained in the paragraph of advantages described later.

In the second embodiment, although the two blocks BK<i>, BK<i+1> are disposed adjacent to each other, other block may be interposed therebetween. Further, although the select gate lines on the bit line side are shared by the two blocks BK<i>, BK<i+1>, the select gate lines on the bit line side may be shared by at least three blocks or by all the blocks in the memory cell array.

C. Other Embodiment

Figure 17:
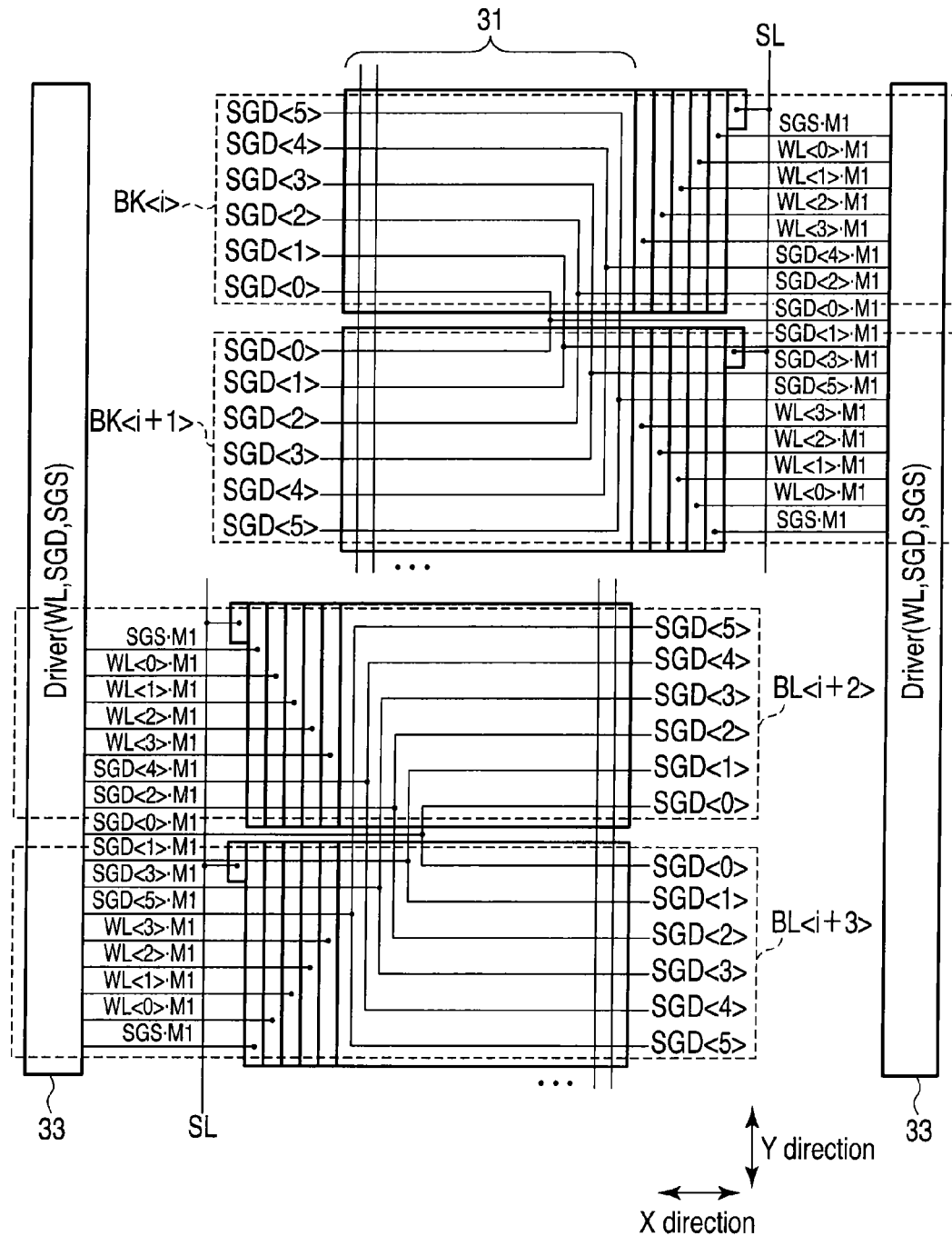
FIG. 17 is a conceptual view of a layout of other embodiment.

FIG. 17 shows a layout in which drivers are disposed on both the sides of a memory cell array.

As shown in FIG. 17, when the drivers 33 are disposed on both the sides of the memory cell array 31, the size of the drivers 33 in the Y-direction per, for example, one block can be increased (the number of transistors can be increased). As a result, since the size of the drivers 33 in the X-direction can be decreased (the number of transistors can be decreased), the layout of interconnect lines (conductive wires) WL<0>•M1, ..., WL<3>•M1, SGS•M1, ..., SGD<0>•M1, SGD<5>•M1 in an interconnect portion 36 is further simplified.

Note that whether the drivers 33 (33L and 33R) are disposed on one sides of the memory cell arrays 31 (31L and 31R) as shown in FIGS. 10 to 12 or the drivers 33 are disposed on both the sides of the memory cell array 31 as shown in FIG. 17 is determined in consideration of the specification of the BiCS memory (chip), the area efficiency of the peripheral circuit, and the like.

(3) Advantages

Advantages of the present invention will be explained using a BiCS-NAND flash memory as an example.

The number of transfer transistors in adjacent two blocks will be examined when the number of word lines in one block is set to four (four layers), the number of select gate lines on a bit line side is set to eight (one layer), and the number of select gate lines on a source line side is set to one (one layer).

FIG. 18 shows a driver as a first comparative example.

A driver 33 is comprised of a transfer transistor (high voltage transistor) to which a high voltage is applied. Each of row decoders 35 is comprised of an AND circuit and decodes an address signal ADDRESS. Level shifters 34 are connected between the driver 33 and the row decoders 35.

BSTON, VRDEC, RDECANDn<0>, and RDECANDn<1> are control signals for turning on and off transfer transistors, and SGDi<7:0>, SGD(i+1)<7:0>, CGi<3:0>, CG(i+1)<3:0>, SGSi, SGS(i+1), RDECADi, RDECAD(i+1), and SGDS are transfer voltages.

The size (driving force) of the transfer transistors in the driver 33 is larger than that (driving force) of ordinary transistors. Accordingly, reduction of the number of the transfer transistors is effective to suppress the area of a peripheral circuit (driver).

Since the comparative example is a case in which the layout according to the example of the present invention is not employed, 44 transfer transistors are necessary in at least two blocks BK<i>, BK<i+1>.

The 44 transfer transistors are broken down as follows:

8 transfer transistors TCGi<3:0>, TCG(i+1)<3:0> to 8 (=4×2 blocks) word lines WL<3:0> in the blocks BK<i>, BK<i+1>;

32 transfer transistors TSGDi<7:0>, TSGD(i+1)<7:0>, T0<7:0>, T1<7:0> to 16 (=8×2 blocks) select gate lines SGD<7:0> on the bit line side in the blocks BK<i>, BK<i+1>; and 4 transfer transistors TSGSi, TSGS(i+1), RDECADi, RDECAD(i+1) to 2 (=1×2 blocks) select gate lines SGS on the source line side in the blocks BK<i>, BK<i+1>.

The transfer transistors <7:0>, T0<7:0> AND the control signal RDECANDn<O> and the control signal RDECANDn<1>. That is, when both the control signals are "1", SGDS is transferred to the select gate line SGD<7:0> on the bit line side.

Figure 19:
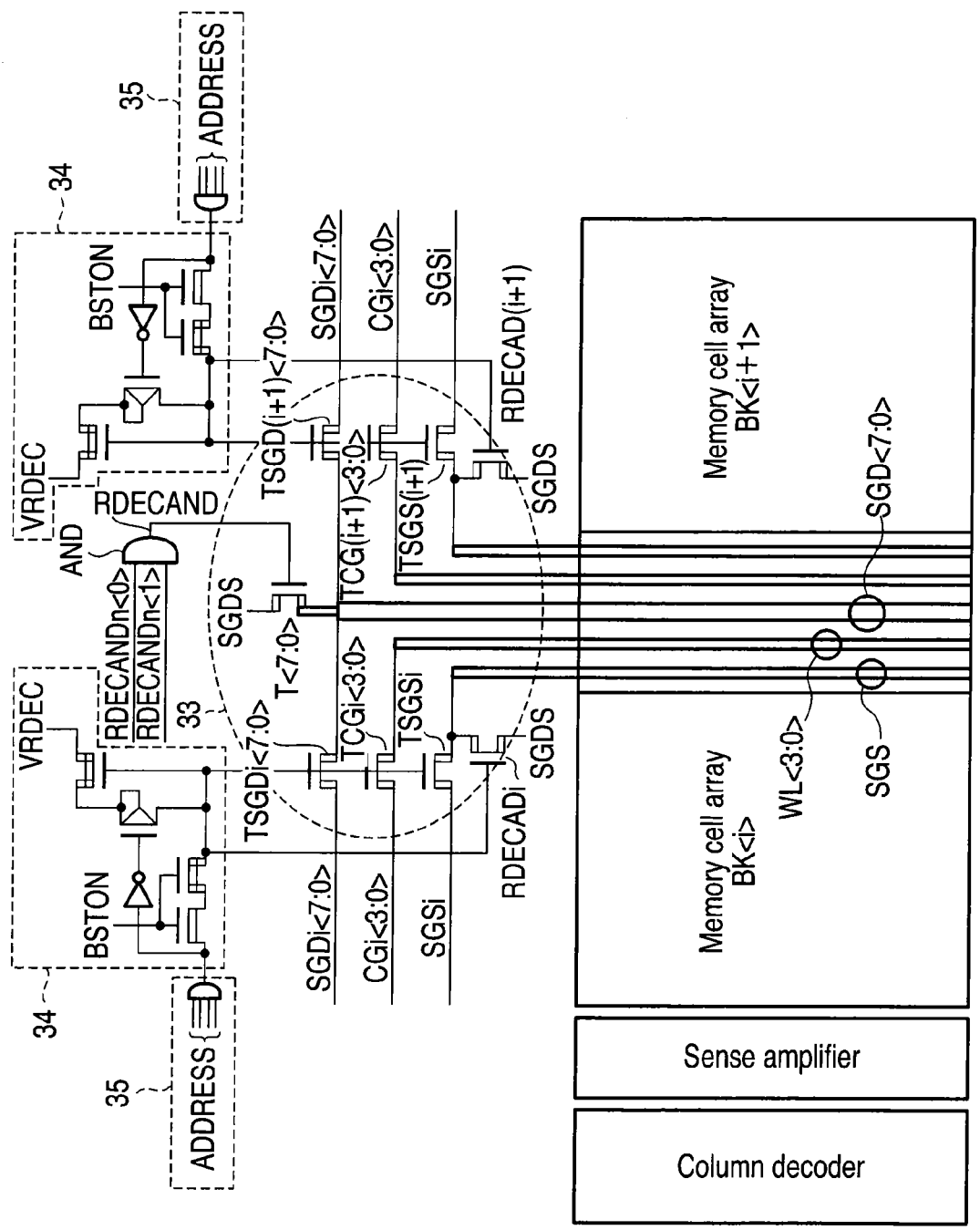
FIG. 19 is a view showing a driver as a second comparative example.

FIG. 19 shows a driver as a second comparative example.

The second comparative example has a feature in that the number of transfer transistors for transferring the transfer voltage SGDS to the select gate line SGD<7:0> on the bit line side can be made half that of the first comparative example by newly adding an AND circuit AND.

Accordingly, the second comparative example requires 36 transfer transistors in the two blocks BK<i>, BK<i+1>.

The 36 transfer transistors are broken down as follows:

8 transfer transistors TCGi<3:0>, TCG(i+1)<3:0> to 8 (=4×2 blocks) word lines WL<3:0> in the blocks BK<i>, BK<i+1>;

24 transfer transistors TSGDi<7:0>, TSGD(i+1)<7:0>, T<7:0> to 16 (=8×2 blocks) select gate lines SGD<7:0> on the bit line side in the blocks BK<i>, BK<i+1>; and 4 transfer transistors TSGSi, TSGS(i+1), RDECADi, RDECAD(i+1) to 2 (=1×2 blocks) select gate lines SGS on the source line side in the blocks BK<i>, BK<i+1>.

As described above, the first and second comparative examples require at least 35 transfer transistors in the two blocks. To practically use a BiCS memory, it is desired to employ transfer transistors whose number is less than 35 pieces in the two blocks.

Employing the layout of the select gate transistors on the bit line side according to the example of the present invention can contribute to practical use of the BiCS memory satisfying the above requirements.

Figure 20:
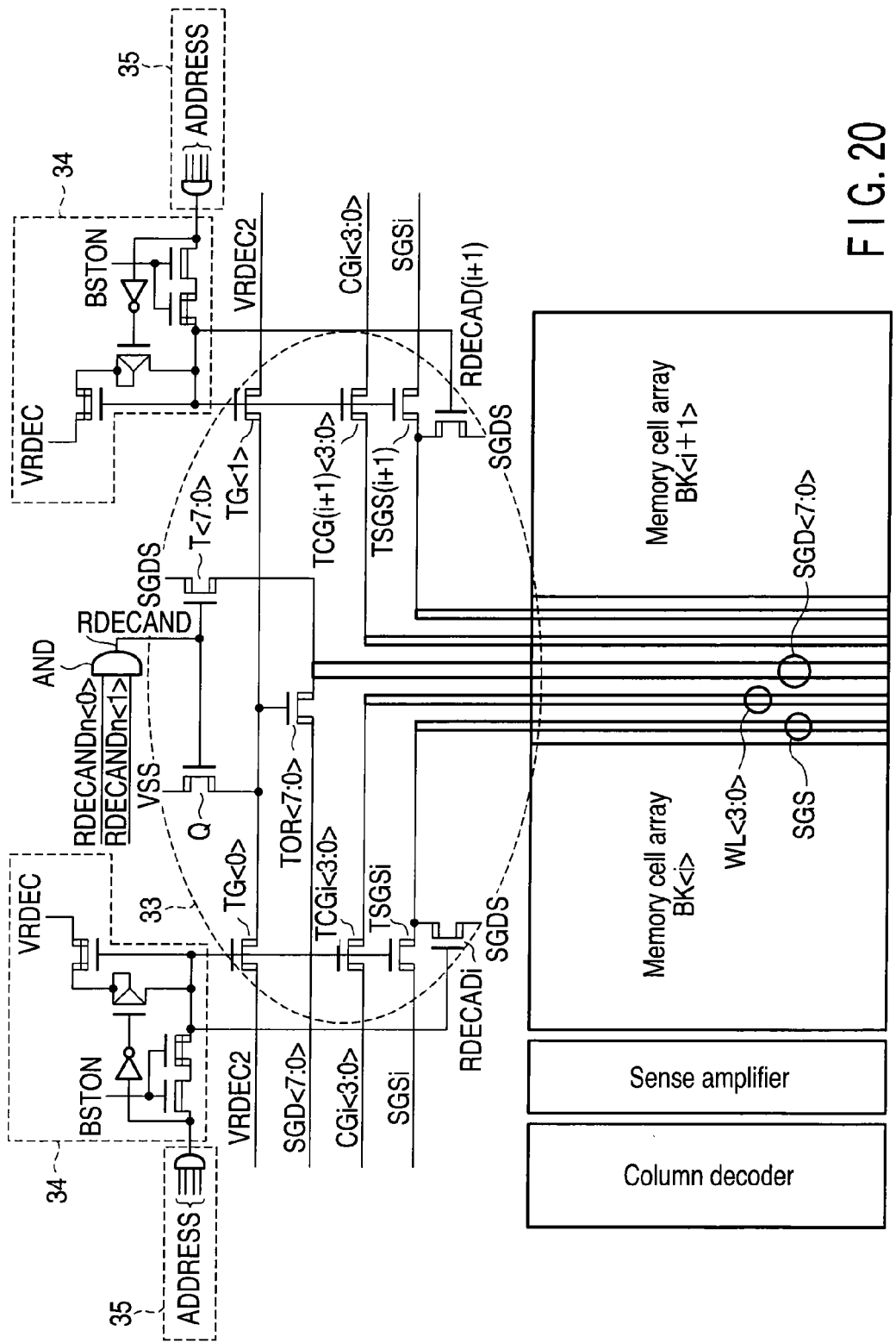
FIG. 20 is a view showing a driver as an example of the present invention.

FIG. 20 shows a driver according to the example of the present invention.

The example of the present invention has a feature in that the number of transfer transistors for transferring the transfer voltage SGDi<7:0> to the select gate lines SGD<7:0> on the bit line side in the two blocks is shared as compared with the second comparative example. Further, three transfer transistors TG<0>, TG<1>, Q<0> are newly added due to the above arrangement.

As a result, the example of the present invention requires 31 transfer transistors in the two blocks BK<i>, BK<i+1>.

The 31 transfer transistors are broken down as follows:

8 transfer transistors TCGi<3:0>, TCG(i+1)<3:0> to 8 (=4×2 blocks) word lines WL<3:0> in the blocks BK<i>, BK<i+1>;

19 transfer transistors TOR<7:0>, T<7:0>, TG<0>, TG<1>, Q to 16 (=8×2 blocks) select gate lines SGD<7:0> on the bit line side in the blocks BK<i>, BK<i+1>; and 4 transfer transistors TSGSi, TSGS(i+1), RDECADi, RDECAD(i+1) to 2 (=1×2 blocks) select gate lines SGS on the source line side in the blocks BK<i>, BK<i+1>.

As described above, in the example of the present invention, it is only necessary to provide the 31 transfer transistors in the two blocks. That is, an increase of the area of the peripheral circuit can be suppressed by disposing transfer transistors whose number is less than 35 pieces in adjacent two blocks in a BiCS-NAND flash memory in which the number of word lines in one block is set to four (four layers), the number of select gate lines on the bit line side is set to eight (one layer), and the number of select gate lines on the source line side is set to one (one layer).

Thus, employing the layout of the select gate transistors on the bit line side according to the example of the present invention can contribute to practical use of the BiCS memory.

An operation of the circuit in FIG. 20 is described below.

TOR<7:0> is a first switch (a high voltage type N-channel MOS transistor) which supplies a first signal SGD<7:0> to the select gate line SGD<7:0>.

T<7:0> is a second switch (a high voltage type N-channel MOS transistor) which supplies a second signal SGDS to the select gate line SGD<7:0>.

The select gate line SGD<7:0> is commonly connected to a gate of a first select gate transistor in the first block BK<i> and a gate of a second select gate transistor in a second block BK<i+1>.

RDECANDn<0> becomes "0" when the first block BK<i> is selected. And RDECANDn<1> becomes "0" when the second block BK<i+1> is selected.

Therefore, an output signal RDECAND of the AND circuit AND becomes "0", when one of the first and second blocks BK<i>, BK<i+1> is selected. In this situation, the first switch TOR<7:0> turns on, the second switch T<7:0> turns off and the first signal SGD<7:0> is supplied to the select gate line SGD<7:0>.

And, an output signal RDECAND of the AND circuit AND becomes "1", when both of the first and second blocks BK<i>, BK<i+1> is unselected. In this situation, the first switch TOR<7:0> turns off, the second switch T<7:0> turns on and the second signal SGDS is supplied to the select gate line SGD<7:0>.

(4) Conclusion

As described above, according to the embodiments of the present invention, it can be found that an increase of the area of a peripheral circuit of a three dimensional stacked nonvolatile semiconductor memory to which a BiCS technology is applied can be suppressed.

4. Application Example

Although the technology of the present invention is effective for a BiCS-NAND flash memory in which one cell unit is comprised of memory cells (NAND columns) connected to each other in series to realize bit cost scalability, the technology can be also applied to a three dimensional stacked nonvolatile semiconductor memory to which the BiCS technology is applied in addition to the above BiCS-NAND flash memory.

For example, the technology of the present invention is also effective for a nonvolatile semiconductor memory which has exactly the same device structure as that of the BiCS-NAND flash memory but in which only one central memory cell of memory cells in one cell unit is used as a memory cell and the remaining memory cells are used as dummy cells as an example other than the BiCS-NAND flash memory.

Further, as to a memory cell structure of the BiCS memory, it is considered that a so-called MONOS type, in which a charge accumulation layer is comprised of an insulation material (for example, nitride), is effective, but the example of the present invention is not limited thereto and can be also applied to a floating gate type in which a charge accumulation layer is comprised of conductive polysilicon.

Further, a data value stored in one memory cell may be a binary value (two-level) or a multivalue (multi-level) of at least a ternary value (three-level).

5. Advantages

According to the present invention, an increase of the area of a peripheral circuit of a three dimensional stacked nonvolatile semiconductor memory to which a BiCS technology is applied can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a semiconductor substrate;
a memory cell array including of first block and second block, the first block being adjacent to the second block, the first block including a first memory cell, a second memory cell and a first transistor, the second block including a third memory cell, a fourth memory cell and a second transistor, the first memory cell being stacked above the semiconductor substrate, the second memory cell being stacked above the first memory cell in a first direction perpendicular to the semiconductor substrate, the third memory cell being stacked above the semiconductor substrate, the fourth memory cell being stacked above the third memory cell in the first direction; and
a first line electrically connected to both the first transistor and the second transistor.

2. The memory according to claim 1, wherein the first memory cell and the second memory cell are arranged above the semiconductor substrate and the third memory cell and the fourth memory cell are arranged above the semiconductor substrate.

3. The memory according to claim 2, further comprising:
a bit line electrically connected to both one end of current pathway of the first transistor and one end of current pathway of the second transistor.

4. The memory according to claim 3, wherein the first line is electrically connected to the first transistor via contact.

5. The memory according to claim 1, further comprising:
a bit line electrically connected to both one end of current pathway of the first transistor and one end of current pathway of the second transistor.

6. The memory according to claim 1, wherein the first line is electrically connected to the first transistor via contact.

7. The memory according to claim 1, further comprising a first memory string and a second memory string, the first memory string including the first memory cell and the second memory cell, the second memory string including the third memory cell and the fourth memory cell.

8. A nonvolatile semiconductor memory comprising:
a semiconductor substrate;
a memory cell array including of a first block and a second block, the first block being adjacent to the second block, the first block including a first memory string and a second memory string, the second block including a third memory string and a fourth memory string, both the first memory string and the second memory string being electrically connected to a first bit line, both the third memory string and the fourth memory string being electrically connected to a second bit line, the first memory string including a first transistor, the second memory string including a second transistor, the third memory string including a third transistor, the fourth memory string including a fourth transistor, the first bit line being different from the second bit line, the first memory string being stacked above the semiconductor substrate, the second memory string being stacked above the first memory string in a first direction perpendicular to the semiconductor substrate, the third memory string being stacked above the semiconductor substrate, the fourth memory string being stacked above the third memory string in the first direction; and
a first line electrically connected to either the first transistor or the second transistor, the first line electrically connected to either the third transistor or the fourth transistor.

9. The memory according to claim 8, wherein the first memory string includes first memory cells, the second memory string includes second memory cells, the third memory string includes third memory cells, the fourth memory string includes fourth memory cells, and a part of the first memory cells to the fourth memory cells is stacked above the semiconductor substrate.

10. The memory according to claim 9, wherein first line is electrically connected to the first driver via contact.

11. The memory according to claim 8, wherein first line is electrically connected to the first driver via contact.

12. A nonvolatile semiconductor memory comprising:
a semiconductor substrate; and
a memory cell array comprising first and second blocks disposed on the semiconductor substrate side by side in a first direction,
wherein each of the first and second blocks comprises at least three conductive layers stacked above the semiconductor substrate by being insulated from each other, a bit line disposed above the at least three conductive layers by being insulated therefrom, and columnar semiconductors passing through the at least three conductive layers,
wherein an uppermost layer of the at least three conductive layers comprises select gate lines extending in the second direction, remaining conductive layers excluding the uppermost layer of the at least three conductive layers are a word lines,
wherein select gate transistors comprise the select gate lines and the columnar semiconductors, and memory cells comprise the word lines and the columnar semiconductors, respectively, and a selected first cell unit and non-selected second cell units are connected to the bit line, and each of the selected first cell unit and the non-selected second cell units comprise the memory cells and the select gate transistors.

13. The memory according to claim 12, wherein the word lines and the other select gate lines in the first and second blocks are connected to a first driver, respectively.

14. The memory according to claim 12, wherein the word lines and the other select gate lines in the first and second blocks are connected to a second driver disposed on the other end in the second direction of the memory cell array, respectively.

15. The memory according to claim 12, wherein an i-th (i is a natural number) first select gate line from the second block side of the first select gate line in the first block is commonly connected an i-th first select gate line from the first block side of the first select gate line in the second block.

16. The memory according to claim 12, wherein the memory cell is a MONOS memory cell which stores data by accumulating a charge in insulation films between the word line and the columnar semiconductor.

17. The memory according to claim 12, wherein one end in the second direction of the at least three conductive layers is formed stepwise.

18. The memory according to claim 17, wherein one end in the second direction of each of the at least three conductive layers is connected to an interconnect line located above the at least three conductive layers through a contact plug.

19. The memory according to claim 17, wherein one end in the second direction of each of the at least three conductive layers excluding the uppermost layer is connected to an interconnect line located above the at least three conductive layers through a contact plug.

20. The memory according to claim 12, wherein the columnar semiconductors are disposed in the first direction, and the bit line extends in the first direction.

21. The memory according to claim 12, further comprising a second driver disposed on the other end in the second direction of the memory cell array.

22. The memory according to claim 12, further comprising a sense amplifier disposed on one end in the first direction of the memory cell array and connected to the bit line.

23. The memory according to claim 12, further comprising a memory string, the memory string including the memory cells which have the word lines as the remaining conductive layers.

* * * * *